(12) United States Patent
Ohta

(10) Patent No.: US 7,223,664 B2
(45) Date of Patent: May 29, 2007

(54) SEMICONDUCTOR DEVICE AND METHOD FOR FABRICATING THE SAME

(75) Inventor: Hiroyuki Ohta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/066,222

(22) Filed: Feb. 28, 2005

(65) Prior Publication Data

US 2006/0094177 A1    May 4, 2006

(30) Foreign Application Priority Data

Nov. 1, 2004   (JP) .............................. 2004-317703

(51) Int. Cl.
*H01L 21/336* (2006.01)
(52) U.S. Cl. ................ 438/303; 438/305; 257/E21.644
(58) Field of Classification Search ................ 438/305, 438/303, 304
See application file for complete search history.

(56) References Cited

U.S. PATENT DOCUMENTS 6,551,887 B2 *   4/2003   Kwon et al. ................ 438/305
6,746,927 B2 *   6/2004   Kammler et al. ........... 438/303

FOREIGN PATENT DOCUMENTS

JP    7-307465    11/1995

* cited by examiner

*Primary Examiner*—Scott B. Geyer
*Assistant Examiner*—Elias Ullah
(74) *Attorney, Agent, or Firm*—Westerman, Hattori, Daniels & Adrian, LLP.

(57) ABSTRACT

The semiconductor device comprises gate electrodes 50 formed on a silicon substrate 32 with a gate insulation film 48 formed therebetween, source/drain diffused layers 66n, 66p formed in the silicon substrate 32 on both sides of the gate electrodes 50, a skirt-like insulation film 58 formed on a lower part of the side wall of the gate electrode 50 and on the side end of the gate insulation film 48, and a sidewall insulation film 60 formed on the exposed part of the side wall of the gate electrode 50, which is not covered with the skirt-like insulation film 58 and the side surface of the shirt-like insulation film 58.

5 Claims, 24 Drawing Sheets

SEMICONDUCTOR DEVICE AND METHOD FOR FABRICATING THE SAME

CROSS-REFERENCE TO RELATED APPLICATIONS

This application is based upon and claims priority of Japanese Patent Application No. 2004-317703, filed on Nov. 1, 2004, the contents being incorporated herein by reference.

BACKGROUND OF THE INVENTION

The present invention relates to a semiconductor device and a method for fabricating the same, more specifically a semiconductor device including a sidewall insulation film formed on the side wall of a gate electrode and a method for fabricating the same.

As the integration and the speed of semiconductor devices are increased, the nanonization of device structures, as of MOS transistors, etc., is rapidly progressing. Especially gate electrodes are formed not only in nanonized sizes but also with a small gap with respect to adjacent gate electrodes.

The background arts of the present invention are disclosed in e.g., Japanese published unexamined patent application No. Hei 07-307465 (1995).

However, when the gap between adjacent gate electrodes is small, the gap is often filled with an insulation film forming the sidewall insulation film. This makes difficult the ion implantation for forming impurity diffused regions for forming source/drain diffused layers.

On the other hand, too thin sidewall insulation film to be formed makes the distance between the source diffused layer and the drain diffused layer too small, which deteriorates the characteristics of MOS transistors and furthermore makes the operation itself difficult.

SUMMARY OF THE INVENTION

An object of the present invention is to provide a semiconductor device which has a small gap between the adjacent gate electrodes for the purpose of high integration of the semiconductor device but permits the sidewall insulation film to be formed without failure while suppressing the deterioration of the characteristics, and a method for fabricating the same.

According to one aspect of the present invention, there is provided a semiconductor device comprising: a gate electrode formed over a semiconductor substrate with a gate insulation film formed therebetween; a source/drain diffused layer formed in the semiconductor substrate on both sides of the gate electrode; and a sidewall insulation film including a skirt-like first insulation film formed on a lower part of a side wall of the gate electrode, and a second insulation film formed on an exposed part of the side wall of the gate electrode, which is not covered by the first insulation film and on a side surface of the first insulation film.

According to another aspect of the present invention, there is provided a method for fabricating a semiconductor device comprising the steps of: forming a gate electrode over a semiconductor substrate with a gate insulation film formed therebetween; implanting a dopant impurity into the semiconductor substrate with the gate electrode as a mask to form a first impurity diffused region in the semiconductor substrate on both sides of the gate electrode; depositing a first insulation film over the semiconductor substrate and anisotropically etching the first insulation film to form the first insulation film on a side wall of the gate electrode; implanting a dopant impurity into the semiconductor substrate with the gate electrode and the first insulation film as a mask to form a second impurity diffused region in the semiconductor substrate on both sides of the gate electrode; partially removing the first insulation film, leaving the first insulation film at a lower part of the side wall of the gate electrode; and depositing a second insulation film over the semiconductor substrate and anisotropically etching the second insulation film to form the second insulation film on an exposed part of the side wall of the gate electrode, which is not covered by the first insulation film and on a side surface of the first insulation film.

According to the present invention, the offset sidewall insulation film formed on the side wall of a gate electrode is removed, left at a lower end part of the side wall of the gate electrode to thereby form the skirt-like insulation film covering the ends of the source/drain diffused layer nearer to the gate electrode, and the sidewall insulation film is formed on the exposed part of the side wall of the gate electrode, which is not covered by the skirt-like insulation film and on the side surface of the skirt-like insulation film, whereby even when the gap between the adjacent gate electrodes is small, the sidewall insulation film can be formed in a required film thickness without failure while the characteristics are kept from being deteriorated.

BRIEF DESCRIPTION OF THE DRAWINGS

FIGS. 8A–8B, 9A–9B, 10A–10B, 11A–11B, 12A–12B, 13A–3B, 14A–14B, 15A–15B, 16A–16B, 17A–17B, 18A–18B and 19A–19B are sectional views of the semiconductor device according to the first embodiment of the preset invention in the steps of the method for fabricating the same, which illustrate the method.

DETAILED DESCRIPTION OF THE INVENTION

[Principle of the Present Invention]

Figure 1A:
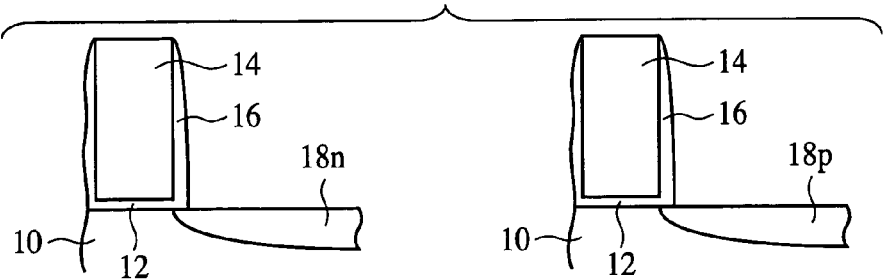
FIGS. 1A–1D are sectional views of the semiconductor device according to the present invention in the steps of the method for fabricating the same, which explain the principle of the present invention.
Figure 1B:
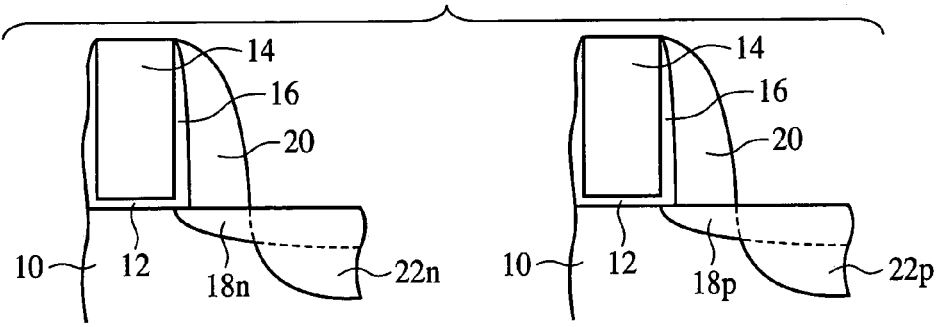
Figure 1C:
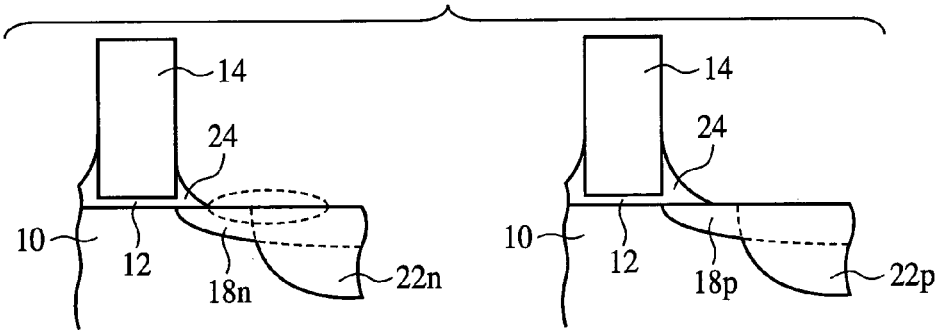

Recently, for the purpose of improving the characteristics of a MOS transistor, an offset is provided in impurity diffused regions forming the source/drain diffused layer. In this case, a plurality of sidewall insulation films are formed on the side wall of the gate electrode, and after the respective sidewall insulation films have been formed, the impurity diffused regions are suitably formed by ion implantation by self-alignment with the gate electrode with the sidewall insulation film formed on.

However, when a plurality of the sidewall insulation films are simply formed, there is a risk that when a gap between the adjacent gate electrodes is small, the gap between the adjacent gate electrodes may be filled with the insulation film. Specifically, for example, the gate electrodes of an about 30 nm-width and an about 100 nm-height are formed with a 200 nm-pitch, and a gap between the side walls of the adjacent gate electrodes is 170 nm, the gap between the adjacent gate electrodes may be filled with the insulation film. When the gap between the adjacent gate electrodes is filled with the insulation film, it makes difficult the ion implantation for forming the impurity diffused regions.

On the other hand, when the film thickness of the sidewall insulation film is too small, the distance between the source diffused layer and the drain diffused layer is too small, which deteriorates the characteristics of the MOS transistor and furthermore makes the operation itself difficult.

The inventor of the present application made earnest studies and has obtained an idea that after impurity diffused regions have been formed by self-alignment with the sidewall insulation film, the sidewall insulation film is removed with a lower end part thereof being left, and the sidewall insulation film is again formed, whereby the sidewall insulation film of a required film thickness can be formed while the gap between the adjacent electrodes is kept from being filled with the insulation film.

The principle of the method for fabricating the semiconductor device according to the present invention will be explained with reference to FIGS. 1A–1D, 2A–2B, 3A–3B, 4 and 5.

FIGS. 1A–1D are sectional views of the semiconductor device in the steps of the method for fabricating the semiconductor device according to the present invention, which explain the principle of the present invention. The sectional views on the left side in FIGS. 1A to 1D are of an NMOS transistor in the steps of the method for fabricating the semiconductor device, and the sectional views on the right side in FIGS. 1A to 1D are of a PMOS transistor in the steps of the method for fabricating the semiconductor device.

First, an offset sidewall insulation film 16 of, e.g., a silicon oxide film is formed on the side wall of a gate electrode 14 formed on a silicon substrate 10 with a gate insulation film 12 formed therebetween.

Then, for the NMOS transistor, a dopant impurity is implanted into the silicon substrate 10 on both sides of the gate electrode 14 by, e.g., ion implantation with the gate electrode 14 and the offset sidewall insulation film 16 as the mask. Thus, shallow n type first impurity diffused regions 18n forming the extension regions of the extension source/drain structure are formed.

For the PMOS transistor, a dopant impurity is implanted into the silicon substrate 10 on both sides of the gate electrode 14 by, e.g., ion implantation with the gate electrode 14 and the offset sidewall insulation film 16 as the mask. Thus, shallow p type first impurity diffused regions 18p forming the extension regions of the extension source/drain structure are formed (see FIG. 1A).

Next, an offset sidewall insulation film 20 of, e.g., a silicon oxide film is further formed on the side wall of the gate electrode 12 with the offset sidewall insulation film 16 formed on.

Next, for the NMOS transistor, with the gate electrode 14 and the offset sidewall insulation films 16, 20 as the mask, a dopant impurity is implanted by, e.g., ion implantation into the silicon substrate 10 on both sides of the gate electrode 14 with the offset sidewall insulation films 16, 20 formed on. Thus, n type second impurity diffused regions 22n which are deeper than the first impurity diffused regions 18n are formed.

For the PMOS transistor, with the gate electrode 14 and the offset sidewall insulation films 16, 20 as the mask, a dopant impurity is implanted by, e.g., ion implantation into the silicon substrate 10 on both sides of the gate electrode 14 with the offset sidewall insulation films 16, 20 formed on. Thus, p type second impurity diffused regions 22p which are deeper than the first impurity diffused regions 18p are formed (see FIG. 1B).

Then, the offset sidewall insulation films 16, 20 are partially removed from the upper end of the gate electrode 14. Thus, a skirt-like insulation film 24 of the partially left offset sidewall insulation films 16, 20 is formed on a lower side part of the side wall of the gate electrode 14 and the side end of the gate insulation film 12 (see FIG. 1C).

Then, relationships between conditions for partially removing the offset sidewall insulation films 16, 20 by wet etching to form the skit-like insulation films 24 and transistor characteristics will be explained.

Figure 2A:
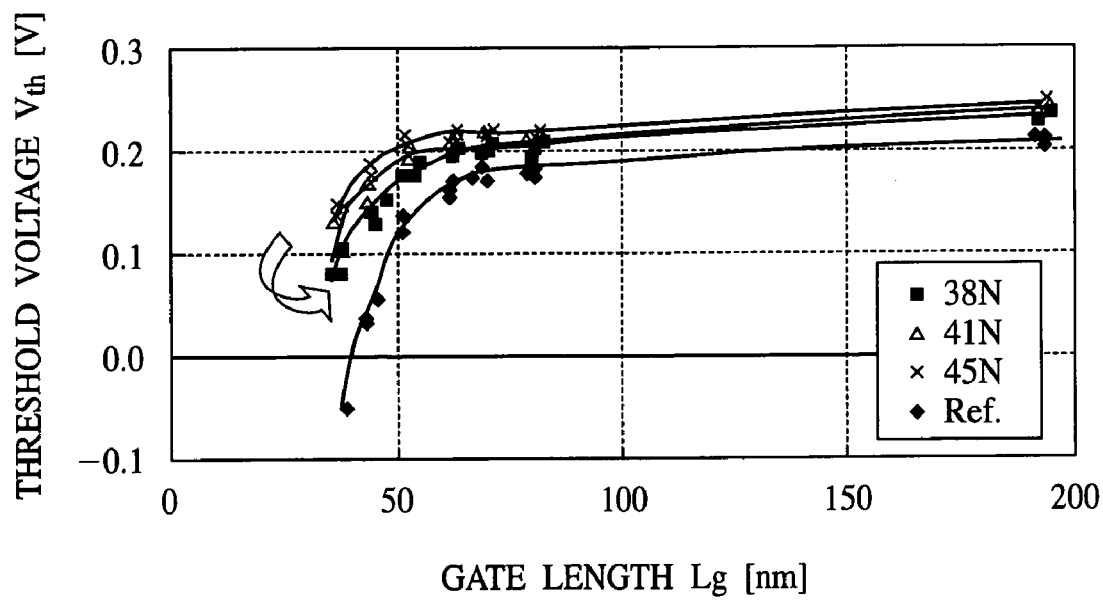
FIGS. 2A–2B are graphs of relationships between the period of time of removing the offset sidewall insulation film and the transistor characteristics for an NMOS transistor.
Figure 2B:
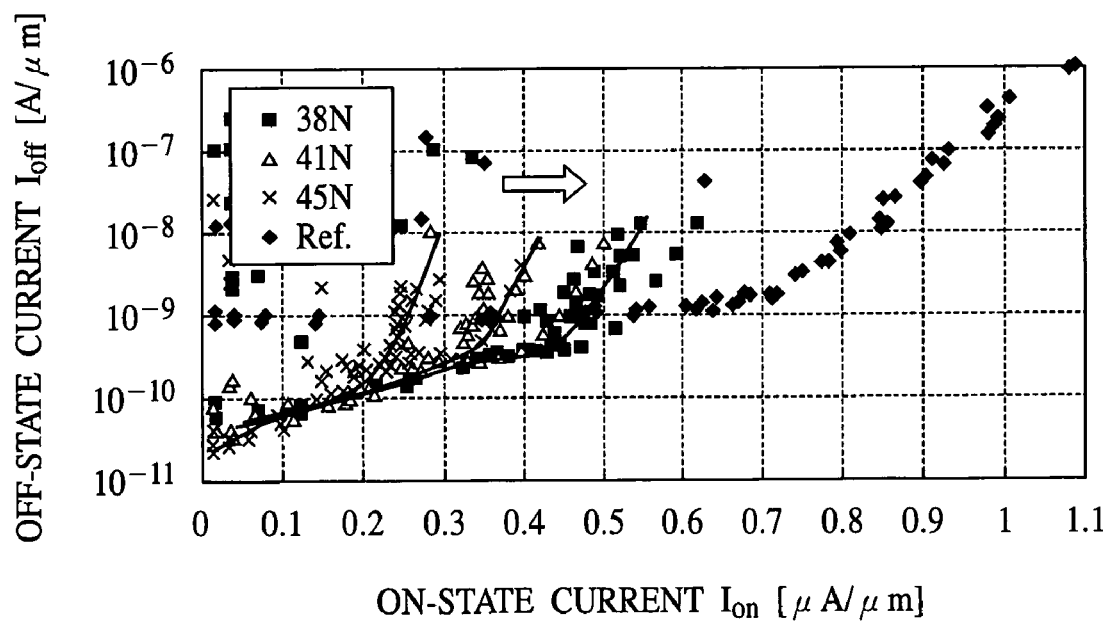

FIGS. 2A–2B are graphs for the NMOS transistor. FIG. 2A is a graph of measured relationships between the gate length $L_g$ and the threshold voltage $V_{th}$. FIG. 2B is a graph of measured relationships between the ON-state current $I_{on}$ and the OFF-state current $I_{off}$ of the transistor. The gate length $L_g$ was measured with a scanning electron microscope. In the graphs of FIGS. 2A–2B, the reference case that the offset sidewalls insulation films 16, 20 were not removed, and the cases that the removing period of time by wet etching was 38N, 41N and 45N were plotted. The reference case is indicated by the ♦ marks, the case of the 38N removing period of time is indicated by the ■ marks, the case of the 42N removing period of time is indicated by the ∆ marks, and the case of the 45N removing period of time is indicated by the × marks. The removing period times 38N, 41N and 45N are relative periods of time, and as the figure is larger, the removing period of time is longer.

Figure 3A:
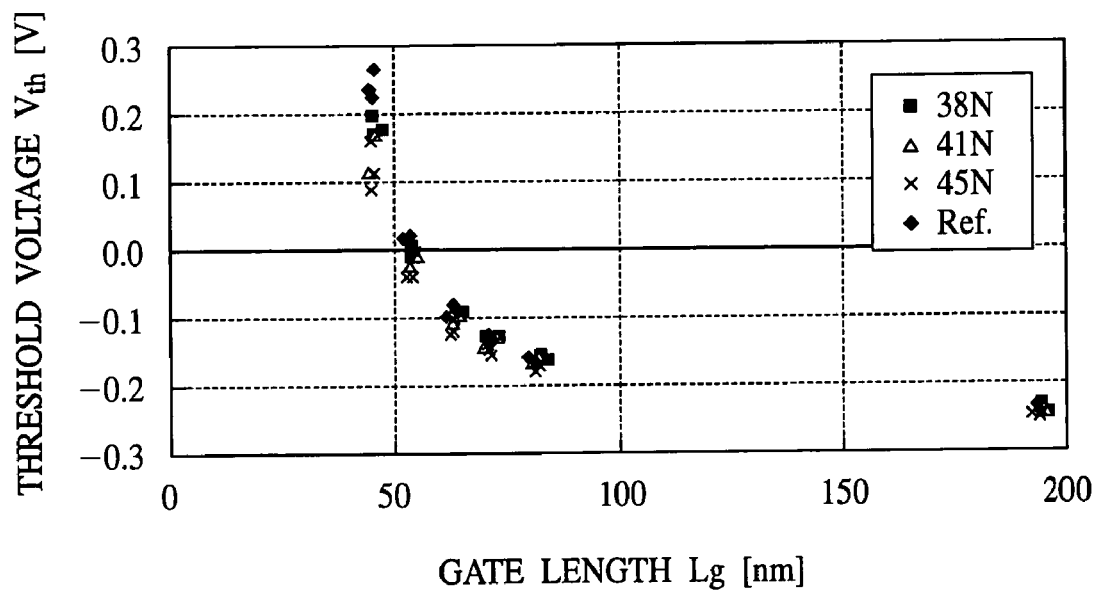
FIGS. 3A–3B are graphs of relationships between the period of time of removing the offset sidewall insulation film and the transistor characteristics for a PMOS transistor.
Figure 3B:
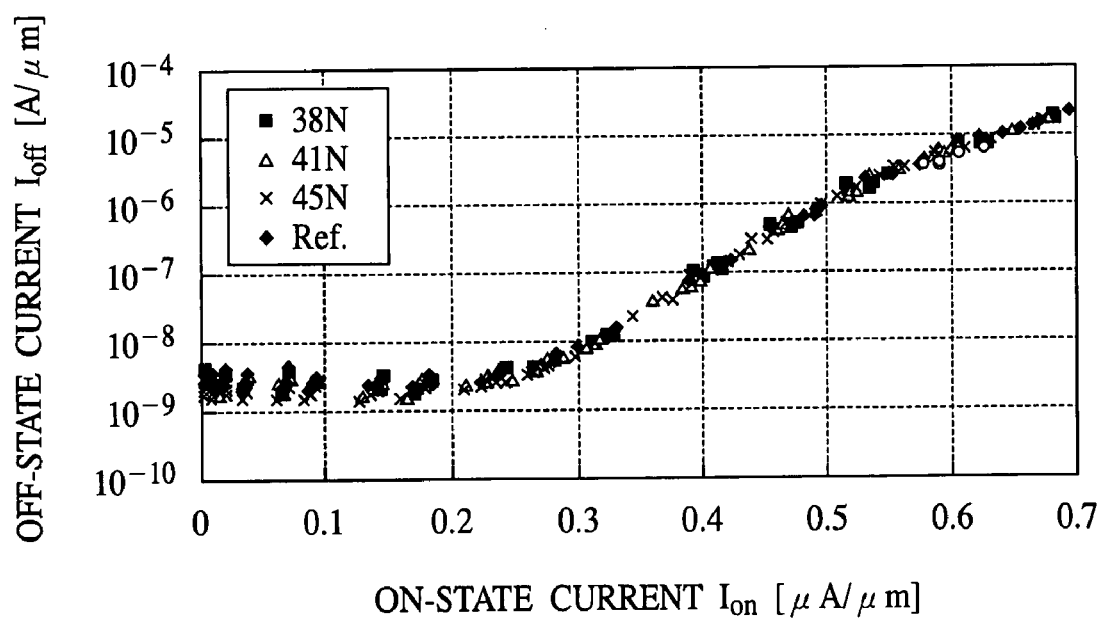

FIG. 3A–3B are graphs for the PMOS transistor. FIG. 2A is a graph of measured relationships between the gate length $L_g$ and the threshold voltage $V_{th}$. FIG. 2B is a graph of measured relationships between the ON-state current $I_{on}$ and the OFF-state current $I_{off}$ of the transistor. The gate length $L_g$ was measured with a scanning electron microscope. In the graphs of FIGS. 2A and 2B as well as in the graphs of FIGS. 2A–2B, the reference case that the offset sidewall insulation films 16, 20 were not removed, and the cases that the removing period of time by wet etching was 38N, 41N and 45N were plotted. The reference case is indicated by the ◆ marks, the case of the 38N removing period of time is indicated by the ■ marks, the case of the 42N removing period of time is indicated by the Δ marks, and the case of the 45N removing period of time is indicated by the × marks.

In the NMOS transistor, as seen in the graph of FIG. 2A, the relationship between the gate length $L_g$ and the threshold voltage $V_{th}$ varies depending on the period of time of etching the offset sidewall insulation films 16, 20.

Also in the NMOS transistor, as seen the graph of FIG. 2B, as the period of time of etching off the offset sidewall insulation films 16, 20 is longer, the ON-state current $I_{on}$ is smaller for the same ON-state current $I_{off}$.

On the other hand, as seen in the graphs of FIGS. 3A–3B, even when the etching period of time of etching off the offset sidewall insulation film 16, 20 varies, the electric characteristics make no substantially change.

Figure 4:
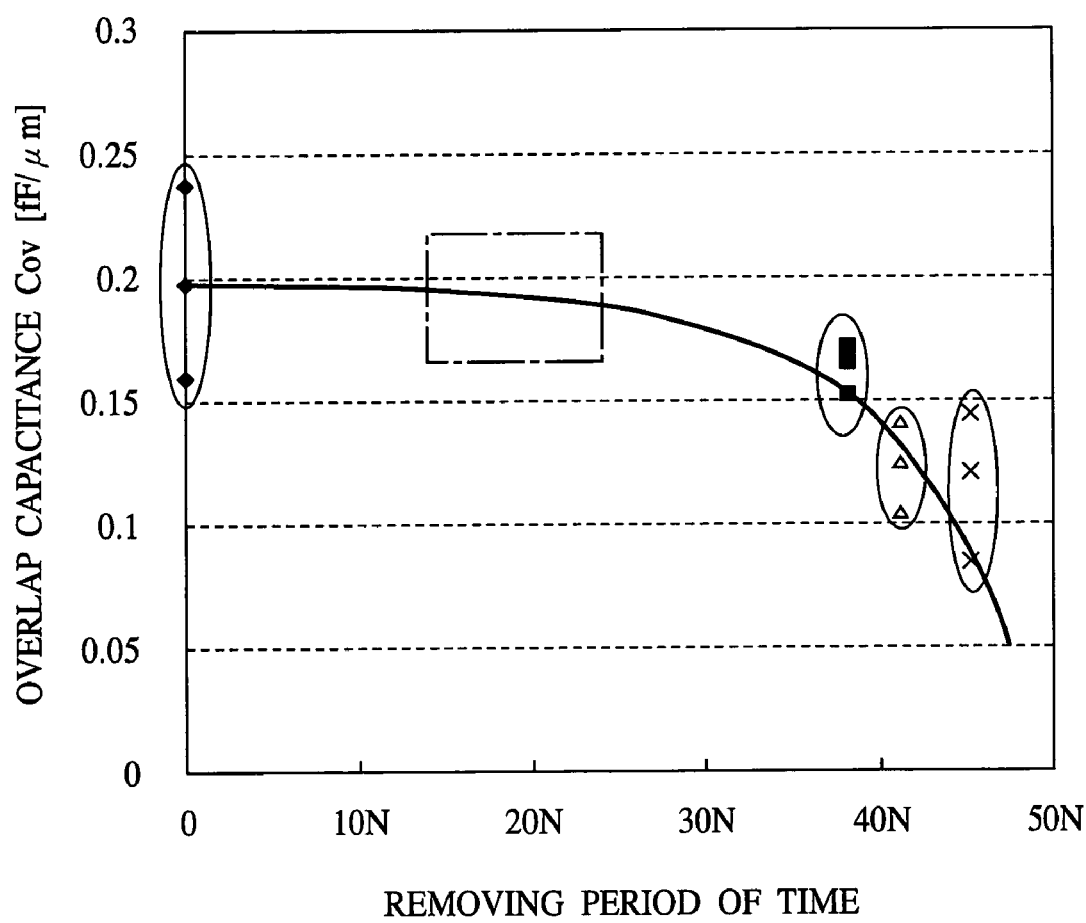
FIG. 4 is a graph of relationships between the period of time of removing the offset sidewall insulation film and the overlap capacitance.

FIG. 4 is a graph of the overlap capacitances $C_{ov}$ between the gate electrode 14 and the source/drain diffused layer of the NMOS transistor which were measured with different removing period of time of wet etching off the offset sidewall insulation films 16, 20 and were plotted with respect to the removing periods of time. In FIG. 4 as well as FIGS. 2A–2B and 3A–3B, the reference case that the offset sidewall insulation films 16, 20 were not removed is indicated by the ◆ marks, the case of the 38N removing period of time is indicated by the ■ marks, the case of the 42N removing period of time is indicated by the Δ marks, and the case of the 45N removing period of time is indicated by the × marks.

As evident in FIG. 4, as the period of time of wet etching off the offset sidewall insulation films 16, 20 is longer, the overlap capacitance $C_{ov}$ is smaller.

As described above, the electric characteristics of the NMOS transistor are much varied and deteriorated, depending on the period of time of wet etching off the sidewall insulation films 16, 20. This reflects the phenomena that the dopant impurity concentration in the surface part (the regions enclosed by the dotted-line ellipse in FIG. 1C) of the impurity diffused region forming the source/drain diffused layer of the NMOS transistor is decreased by the wet etching.

On the other hand, the inventor of the present application has confirmed that both in the NMOS transistor and the PMOS transistor, the resistance value of the source/drain diffused layer makes substantially no change even with changes of the period of time of removing the offset sidewall insulation films 16, 20.

Considering that the resistance value of the source/drain diffused layer does not substantially change, the changes and the deterioration of the electric characteristics of the NMOS transistor shown in FIGS. 2A–2B and 4 will be due to the decrease of the dopant impurity concentration by the wet etching especially at the ends of the first impurity diffused regions 18n nearer to the gate electrode.

Accordingly, if the ends of the first impurity diffused regions 18n nearer to the gate electrode 14 are protected during the wet etching, the changes and the deterioration of the electric characteristics of the NMOS transistor could be suppressed. Specifically, the offset sidewall insulation films 16, 20 are left, covering the ends of the first impurity diffused regions 18n nearer to the gate electrode 14, i.e., the skirt-like insulation film 24 is formed, covering the ends of the first impurity diffused regions 18n nearer to the gate electrode 14, whereby the changes and the deterioration of the electric characteristics of the NMOS transistor can be suppressed.

Figure 5:
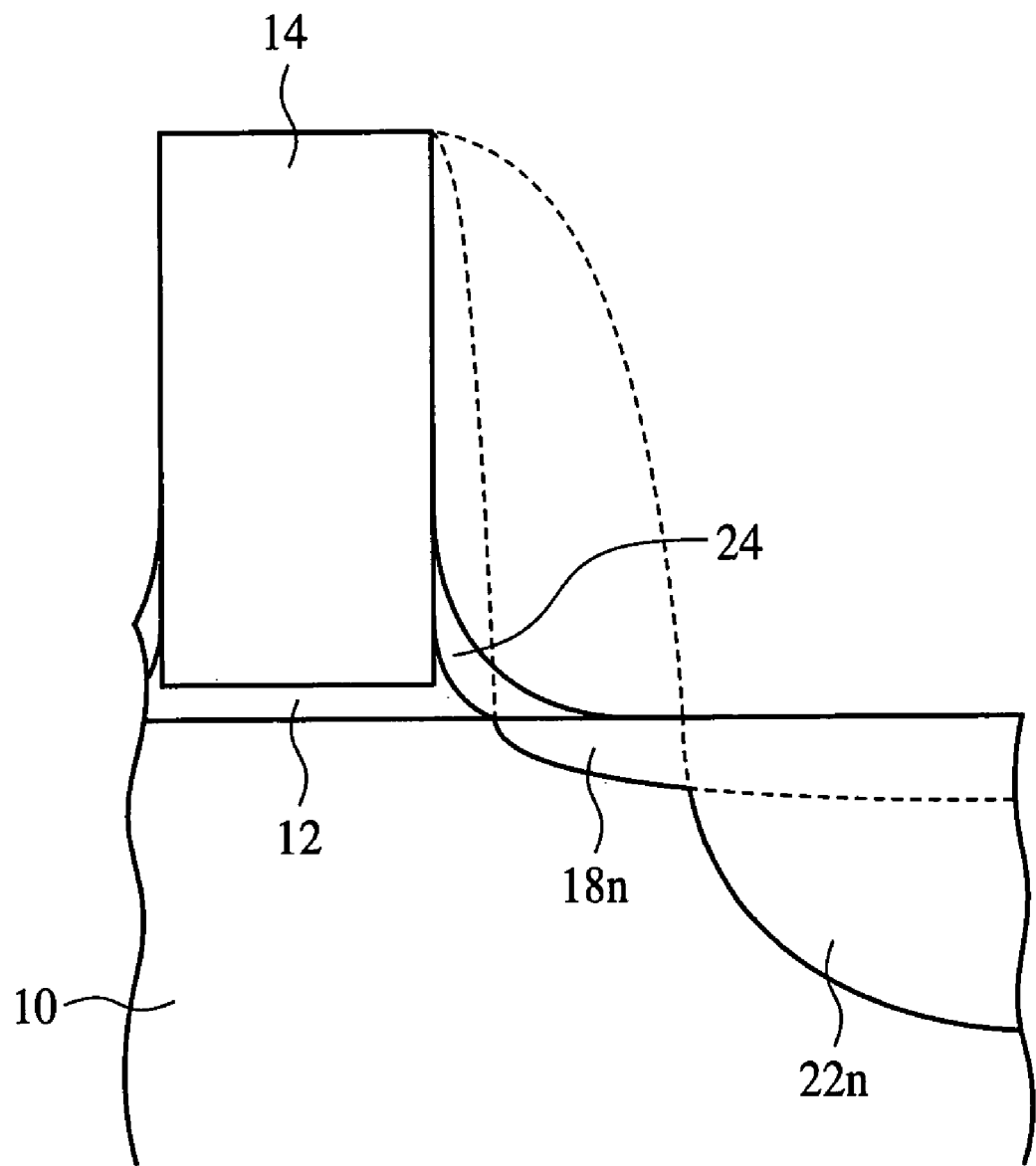
FIG. 5 is a sectional view of the skirt-like insulation film of the present invention.

Then, in the present invention, conditions for partially removing the offset sidewall insulation films 16, 20 by wet etching are so set that, as illustrated in FIG. 5, the skirt-like insulation films 24 cover the ends of the first impurity diffused regions 18n, 18p nearer to the gate electrodes 14. Thus, the skirt-like insulation films 24 can be formed by partially removing the sidewall insulation films 16, 20 while the deterioration of the transistor characteristics due to the decrease of the dopant impurity by the wet etching is suppressed.

For suppressing the decrease of the ON-sate current $I_{on}$ of the NMOS transistor, the removing period of time may be set at, e.g., 38N excluding 38N.

Furthermore, for suppressing the decrease of the overlap capacitance $C_{ov}$ of the NMOS transistor, the removing period of time may be set at, e.g., around 20N (a removing period of time corresponding to the regions enclosed by the dash-dotted line in FIG. 4).

After the skirt-like insulation film 24 has been thus formed, a sidewall insulation film 26 of, e.g., silicon oxynitride film is formed on the exposed part of the side wall of the gate electrode 14, which is not covered by the skirt-like insulation film 24, and on the side surface of the skirt-like insulation film 24.

Here, in the present invention, the offset sidewall insulation films 16, 20 are partially removed from the upper parts, and only the skirt-like insulation film 24 is formed on the side wall of the gate electrode 14 at a lower side part. Accordingly, even when the gap between adjacent gate electrodes 14 is small, the sidewall insulation film can be surely formed in a required film thickness without the gap being filled with the insulation film.

Then, for the NMOS transistor, with the gate electrode 14 and the sidewall insulation film 26 as the mask, a dopant impurity is implanted by, e.g., ion implantation into the silicon substrate 10 on both sides of the gate electrode 14 with the sidewall insulation film 26 formed on the side wall. Thus, n type third impurity diffused regions 28n which are deeper than the second impurity diffused regions 22n are formed.

Thus, for the NMOS transistor, the source/drain diffused layers 30n of the extension source/drain structure of the first impurity diffused region 18n, the second impurity diffused region 22n and the third impurity diffused region 28n are formed.

Then, for the PMOS transistor, with the gate electrode 14 and the sidewall insulation film 26 as the mask, a dopant impurity is implanted by, e.g., ion implantation into the silicon substrate 10 on both sides of the gate electrode 14 with the sidewall insulation film 26 formed on the side wall. Thus, p type third impurity diffused regions 28p which are deeper than the second impurity diffused regions 22p are formed.

Figure 1D:
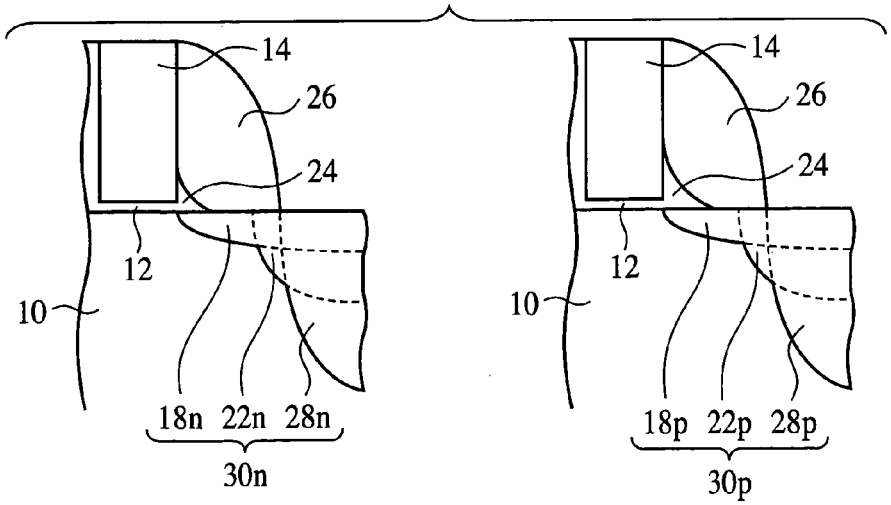

Thus, for the PMOS transistor, the source/drain diffused layers 30p of the extension source/drain structure of the first impurity diffused region 18p, the second impurity diffused region 22p and the third impurity diffused region 28p are formed (see FIG. 1D).

As described above, according to the present invention, the offset sidewall insulation films 16, 20 are partially removed from the upper ends to thereby form the skirt-like insulation films 24 on the lower side parts of the side walls of the gate electrodes 14 and the side end of the gate insulation films 12, covering the sides of the gate electrode 14 in the first impurity diffused regions 18n, 18p, and then the sidewall insulation film 26 is formed. Thus, even when the gap between the adjacent gate electrodes 14 is small, the sidewall insulation film 26 can be surely formed in a required film thickness without the gap between the adjacent gate electrodes being filled with the insulation film suppressing the deterioration of the transistor characteristics is prevented.

[A First Embodiment]

Figure 6:
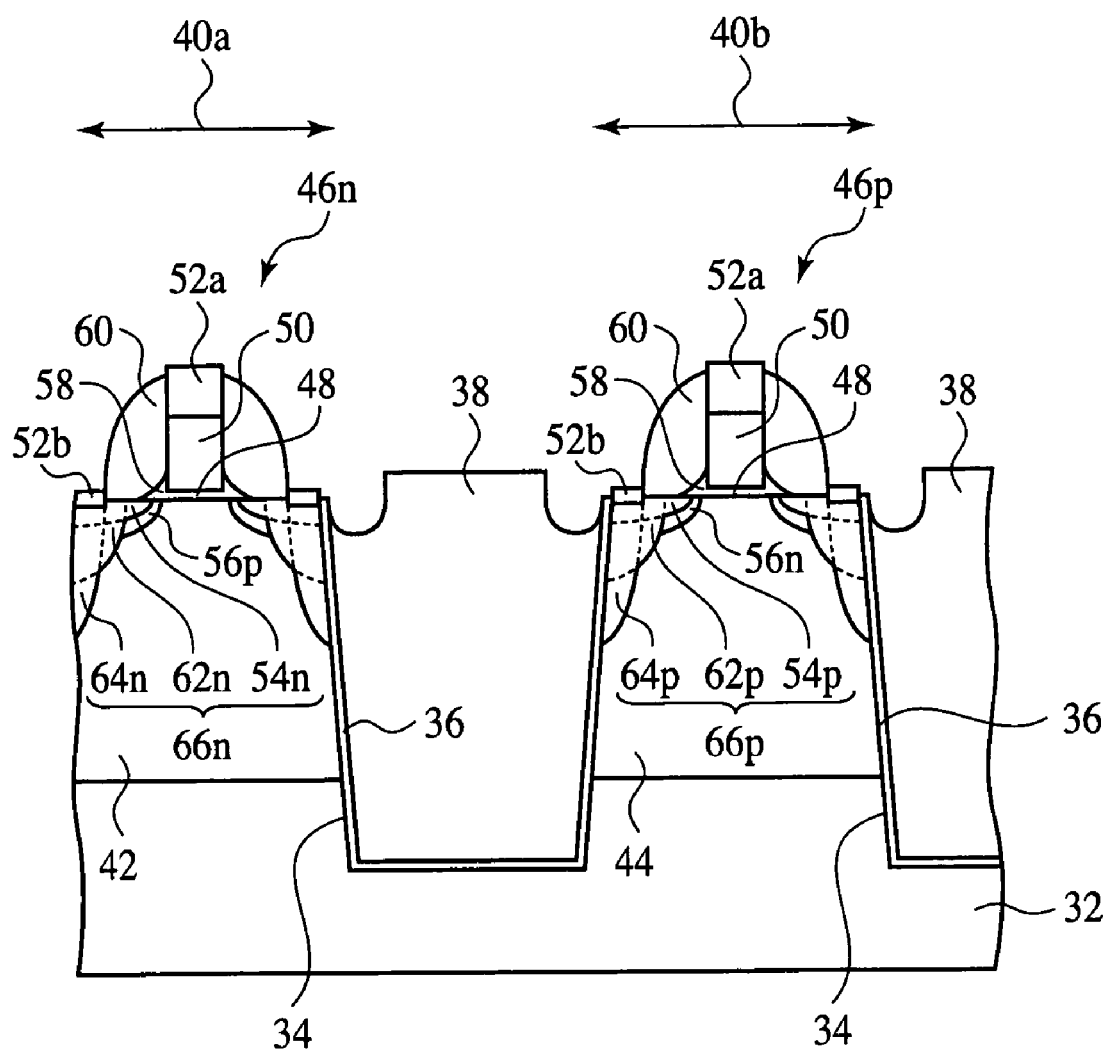
FIG. 6 is a sectional view of the semiconductor device according to a first embodiment of the present invention, which illustrates a structure thereof.
Figure 7:
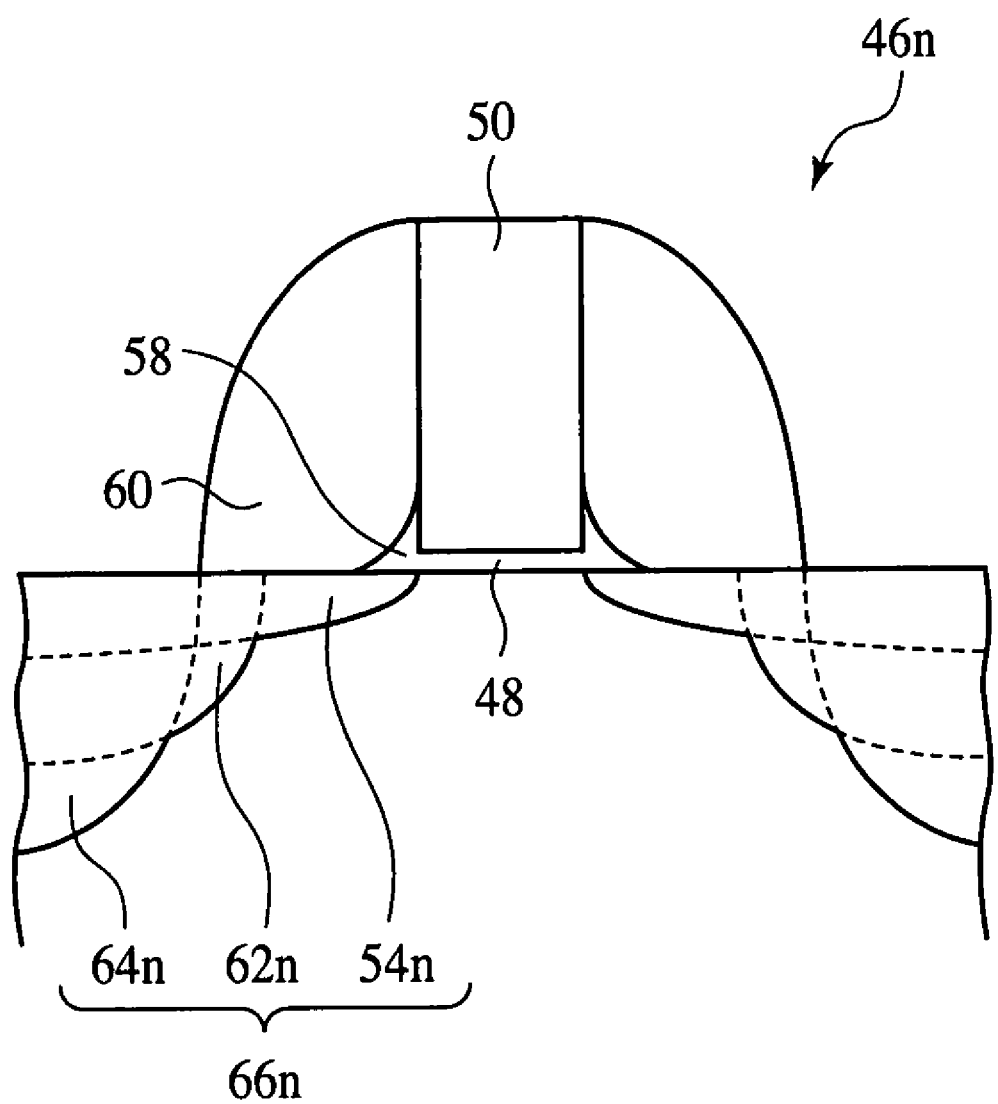
FIG. 7 is an enlarged sectional view of the semiconductor device according to the first embodiment of the present invention, which illustrates the structure thereof.
Figure 8A:
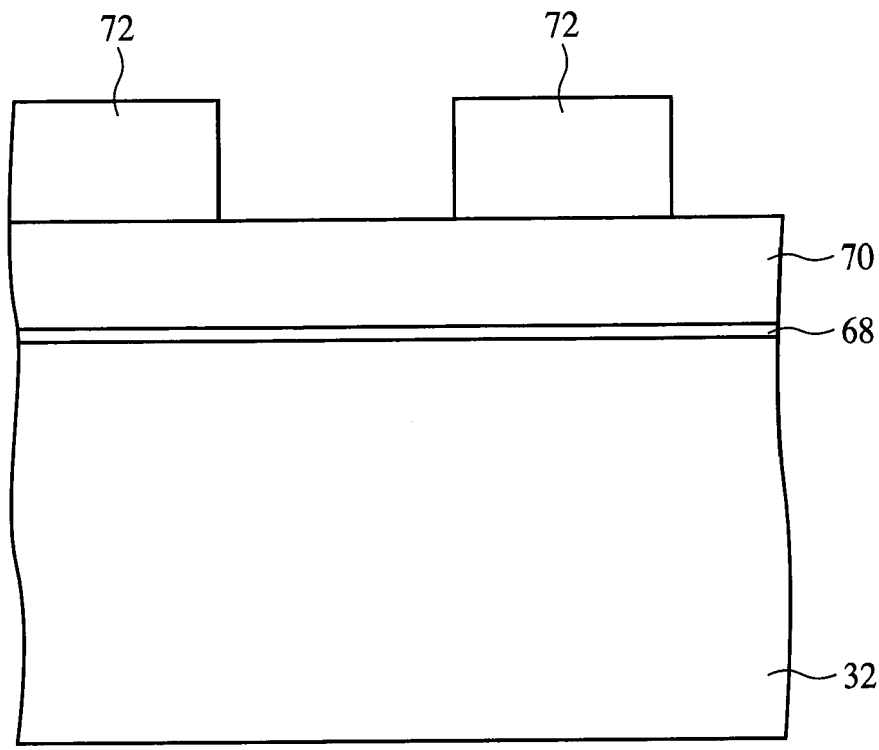
Figure 8B:
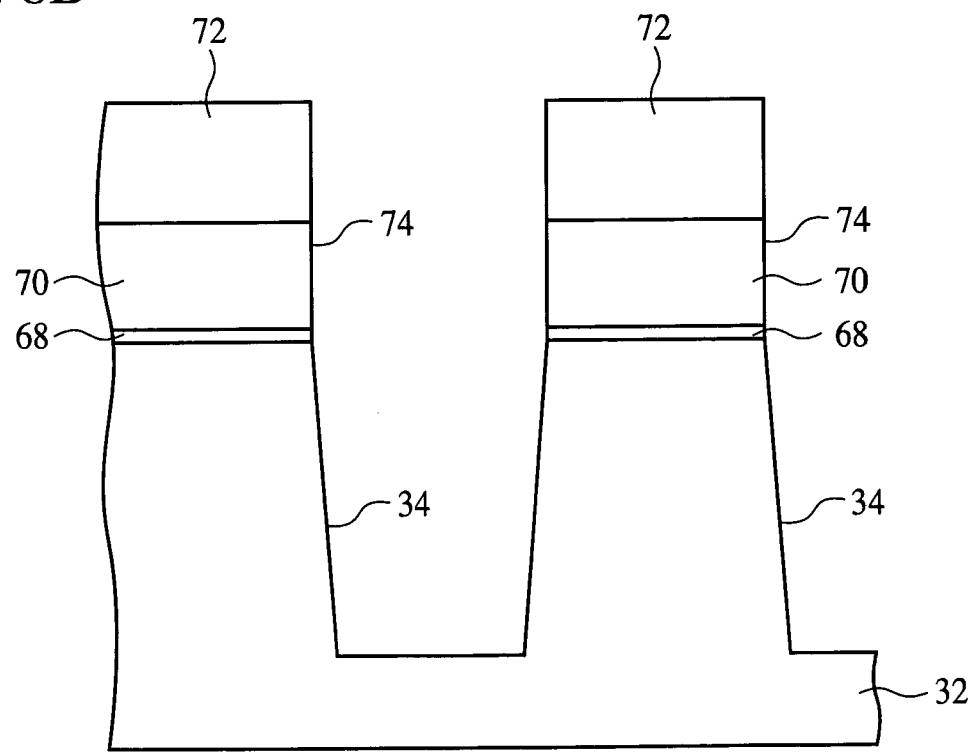

The semiconductor device and the method for fabricating the same according to a first embodiment of the present invention will be explained with reference to FIGS. 6, 7, 8A–8B, 9A–9B, 10A–10B, 11A–11B, 12A–12B, 13A–13B, 14A–14B, 15A–15B, 16A–16B, 17A–17B, 18A–18B and 19A–19B. FIG. 6 is a sectional view of the semiconductor device according to the present embodiment, which illustrates a structure thereof. FIG. 7 is an enlarged view of the semiconductor device according to the present embodiment, which illustrates the structure thereof. FIGS. 8A–8B, 9A–9B, 10A–10B, 11A–11B, 12A–12B, 13A–13B, 14A–14B, 15A–15B, 16A–16B, 17A–17B, 18A–18B and 19A–19B are sectional views of the semiconductor device according to the present embodiment in the steps of the method for fabricating the same, which illustrate the method.

First, the structure of the semiconductor device according to the present embodiment will be explained with reference to FIGS. 6 and 7.

As illustrated in FIG. 6, trenches 34 are formed in a silicon substrate 32. A silicon oxide film 36 is formed on the side surfaces and the bottom surfaces of the trenches 34. A device isolation film 36 is buried in the trenches 34 with the silicon oxide film 36 formed on the side surfaces and the bottom surfaces. The device isolation film 38 defines device regions 40a, 40b.

A P well 42 is formed in the silicon substrate 32 in the device region 40a. An N well 44 is formed in the silicon substrate 32 in the device region 40b.

An NMOS transistor 46n is formed in the device region 40a. A PMOS transistor 46p is formed in the device region 40b.

First, the NMOS transistor 46n formed in the device region 40a will be explained.

On the silicon substrate 32 in the device region 40a, a gate electrode 50 of polysilicon film is formed with a gate insulation film 48 formed therebetween. A metal silicide film 52a is formed on the gate electrode 50.

In the silicon substrate 32 on both sides of the gate electrode 50, shallow n type first impurity diffused regions 54n forming the extension regions of the extension source/drain structure are formed. P type pocket regions 56p are formed below the bottoms of the first impurity diffused regions 54n, adjacent to the first impurity diffused regions 54n.

A skirt-like insulation film 58 of silicon oxide film is formed on a lower side part of the side wall of the gate electrode 50 and the side end of the gate insulation film 48. The skirt-like insulation film 58 covers the ends of the first impurity diffused regions 54n nearer to the gate electrode 50.

A sidewall insulation film 60 of silicon oxynitride film is formed on the exposed part of the side wall of the gate electrode 50, which is not covered with the skirt-like insulation film 58 and on the side surface of the skirt-like insulation film 58.

In the silicon substrate 32 on both sides of the gate electrode 50 with the sidewall insulation film 60 formed on, n type second impurity diffused regions 62n which are deeper than the first impurity diffused regions 54n, n type third impurity diffused regions 64n which are deeper than the second impurity diffused regions 62n are formed. The ends of the second impurity diffused regions 62n nearer to the gate electrode 50 are extended up to below the sidewall insulation film 60. The ends of the third impurity diffused regions 64n nearer to the gate electrode 50 are extended up to the end of the sidewall insulation film 60.

The first impurity diffused region 54n, the second impurity diffused region 62n and the third impurity diffused region 64n form a source/drain diffused layer 66n of the extension source/drain structure. The ends of the source/drain diffused layers 66n nearer to the gate electrode 50, i.e., the ends of the first impurity diffused regions 54n nearer to the gate electrode 50 are covered by the skirt-shaped insulation film 58 as described above.

On the source/drain diffused layers 66n on both sides of the gate electrode 50 with the sidewall insulation film 60 formed on, metal silicide films 52b are formed.

Thus, the NMOS transistor 46n including the gate electrode 50 and the source/drain diffused layers 66n is formed in the device region 40a.

Next, the PMOS transistor 46p formed in the device region 40b will be explained.

On the silicon substrate 32 in the device region 40b, a gate electrode 50 of polysilicon film is formed with the gate insulation film 48 of silicon oxide film formed therebetween. The metal silicide film 52a is formed on the gate electrode 50.

In the silicon substrate 32 on both sides of the gate electrode 50, shallow n type first impurity diffused regions 54p forming the extension regions of the extension source/drain structure are formed. N type pocket regions 56n are formed below the bottom of the first impurity diffused regions 54p, adjacent to the first impurity diffused regions 54p.

The skirt-like insulation film 58 of silicon oxide film is formed on a lower part of the side wall of the gate electrode 50 and the side end of the gate insulation film 48. The skirt-like insulation film 58 covers the ends of the first impurity diffused regions 54p nearer to the gate electrode 50.

The sidewall insulation film 60 of silicon oxynitride film is formed on the exposed part of the side wall of the gate electrode 50, which is not covered with the skirt-like insulation film 58 and the side surface of the skirt-like insulation film 58.

In the silicon substrate 32 on both sides of the gate electrode 50 with the sidewall insulation film 60 formed on, p type second impurity diffused regions 62p which are deeper than the first impurity diffused regions 54p, p type third impurity diffused regions 64p which are deeper than the second impurity diffused regions 62p are formed. The ends of the second impurity diffused regions 62p nearer to the gate electrode 50 are extended up to below the sidewall insulation film 60. The ends of the third impurity diffused regions 64p nearer to the gate electrode 50 are extended up to the end of the sidewall insulation film 60.

The first impurity diffused region 54p, the second impurity diffused region 62p and the third impurity diffused region 64p form a source/drain diffused layer 66p of the extension source/drain structure. The ends of the source/drain diffused layers 66p nearer to the gate electrode 50, i.e., the ends of the first impurity diffused regions 54p nearer to the gate electrode 50 are covered by the skirt-shaped insulation film 58 as described above.

On the source/drain diffused layers 66n on both sides of the gate electrode 50 with the sidewall insulation film 60 formed, the metal silicide films 52b are formed.

Thus, the PMOS transistor 46p including the gate electrode 50 and the source/drain diffused layers 66p is formed in the device region 40b.

FIG. 7 is an enlarged sectional view of the gate electrode 50 and its periphery of the semiconductor device according to the present embodiment. In FIG. 7, the NMOS transistor 46n is illustrated, and the metal silicide films 52a, 52b are omitted.

As illustrated, the skirt-like insulation film 58 is formed on a lower part of the side wall of the gate electrode 50 and the side end of the gate insulation film 48. The skirt-like insulation film 58 covers the ends of the first impurity diffused regions 54n forming the source/drain diffused layer 66n, which are nearer to the gate electrode 50. The side surface of the skirt-like insulation film 58 is, e.g., inwardly convex.

The skirt-like insulation film 58 formed on the gate electrode 50 of the PMOS transistor 46p is the same as that of the NMOS transistor 46n illustrated in FIG. 7.

As described above, the semiconductor device according to the present embodiment is characterized mainly in that on a lower part of the side wall of the gate electrode 50 and the side end of the gate insulation film 48, the skirt-like insulation film 58 covering the ends of the first impurity regions 54n, 54p forming the source/drain diffused layer 66n, 66p, which are nearer to the gate electrodes is formed.

As will be described later, the skirt-like insulation film 58 is formed by partially wet etching off the offset sidewall insulation films used as the mask in the ion implantation for forming the first impurity diffused regions 54n, 54p and the second impurity diffused regions 62n, 62p. Accordingly, even when the gap between the adjacent gate electrodes 50 is small, the sidewall insulation film 60 can be surely formed in a required film thickness without the gap between the adjacent gate electrodes being filled with the insulation film 60. Accordingly, the leak current between the gate electrodes 50 and the source/drain diffused layers 66n, 66p can be sufficiently suppressed.

Because of the skirt-like insulation film 58 formed, covering the ends of the first impurity diffused regions 54n, 54p nearer to the gate electrodes 50, the deterioration of the transistor characteristics by the wet etching for forming the skirt-like insulation film 58 can be suppressed.

Because of the silicon oxide film, whose dielectric constant is 3.9, formed on lower parts of the gate electrodes 50 and the side end of the gate insulation film 48 as the skirt-like insulation film 58, the use of an insulation film of a high dielectric constant, such as silicon nitride film, silicon oxynitride film or others, can decrease the fringe capacitance.

Next, the method for fabricating the semiconductor device according to the present embodiment will be explained with reference to FIGS. 8A–8B, 9A–9B, 10A–10B, 11A–11B, 12A–12B, 13A–13B, 14A–14B, 15A–15B, 16A–16B, 17A–17B, 18A–18B and 19A–19B.

First, a silicon oxide film 68 of, e.g., a 10 nm-thickness is formed on the silicon substrate 32 by, e.g., thermal oxidation.

Next, on the silicon oxide film 68, a silicon nitride film 70 of, e.g., a 100–150 nm-thickness is deposited by, e.g., CVD (Chemical Vapor Deposition).

Then, a photoresist film 72 for exposing the regions for the device isolation film 38 to be formed in and covering the other region is formed on the silicon nitride film 70 by photolithography.

Then, with the photoresist film 72 as the mask, the silicon nitride film 70 is etched. Thus, openings 74 are formed in the silicon nitride film 70.

Next, with the photoresist film 72 and the silicon nitride film 70 as the mask, the silicon oxide film 68 and the silicon substrate 32 are etched. Thus, trenches 34 of, e.g., a 500 nm-depth are formed in the silicon substrate 32 (see FIG. 8B).

After the trenches 34 have been formed, the photoresist film 72 used as the mask is removed.

Figure 9A:
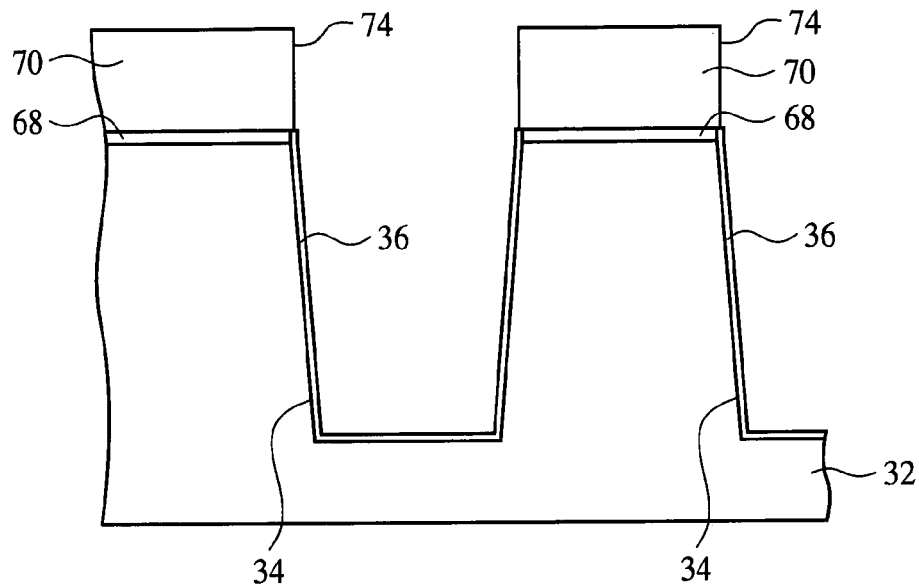

Next, a silicon oxide film 36 of, e.g., a 10 nm-thickness is formed on the side surfaces and the bottom surfaces of the trenches 34 by, e.g., thermal oxidation (see FIG. 9A).

Figure 9B:
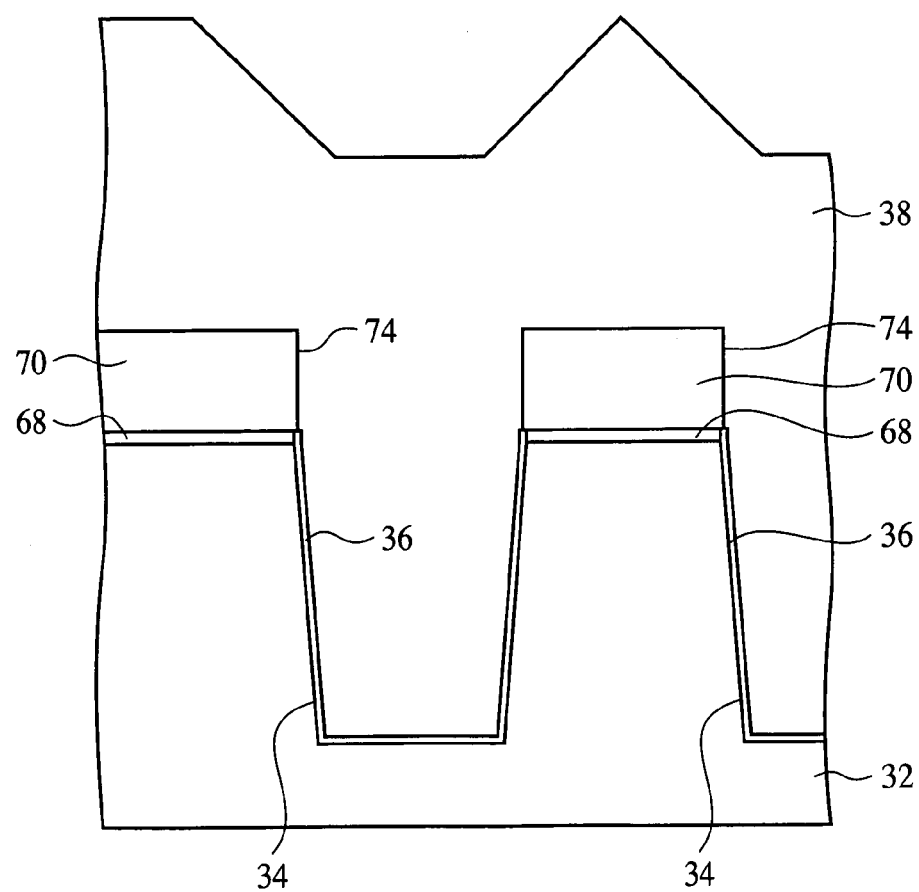

Next, a silicon oxide film 38 of, e.g., a 500 nm-thickness is deposited on the entire surface by, e.g., high density plasma CVD (see FIG. 9B).

Figure 10A:
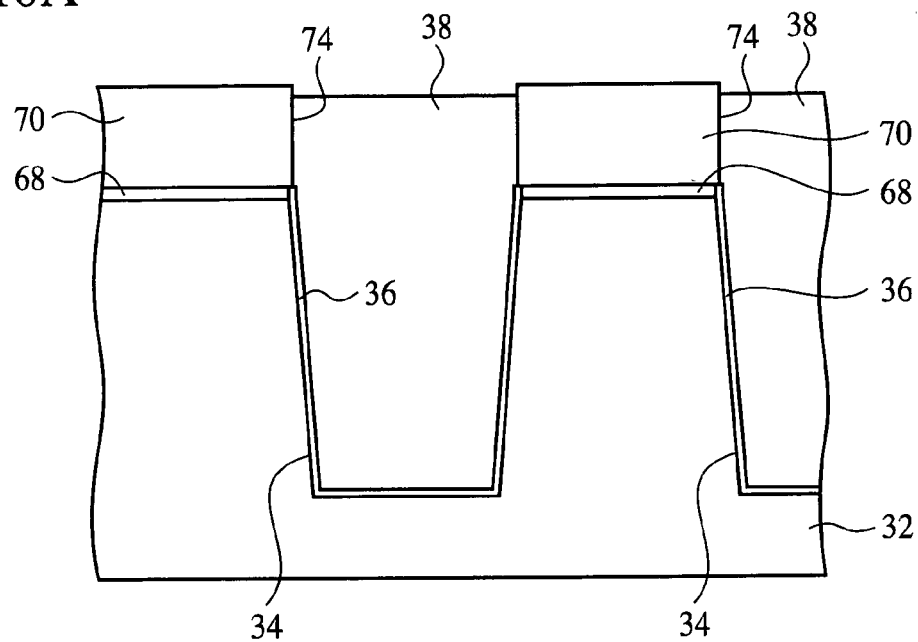

Then, the silicon oxide film 38 is polished by, e.g., CMP (Chemical Mechanical Polishing) until the surface of the silicon nitride film is exposed to thereby remove the silicon oxide film 38 on the silicon nitride film 70 (see FIG. 10A). Thus, the silicon oxide film 38 is planarized, filling the trenches 34 and the openings 74 with the silicon oxide film 38. Thermal processing for densifying the silicon oxide film 38 may be performed after the silicon oxide film 38 has been planarized. The thermal processing is performed in, e.g., a nitrogen atmosphere and at the thermal processing temperature of, e.g., 1000° C.

Figure 10B:
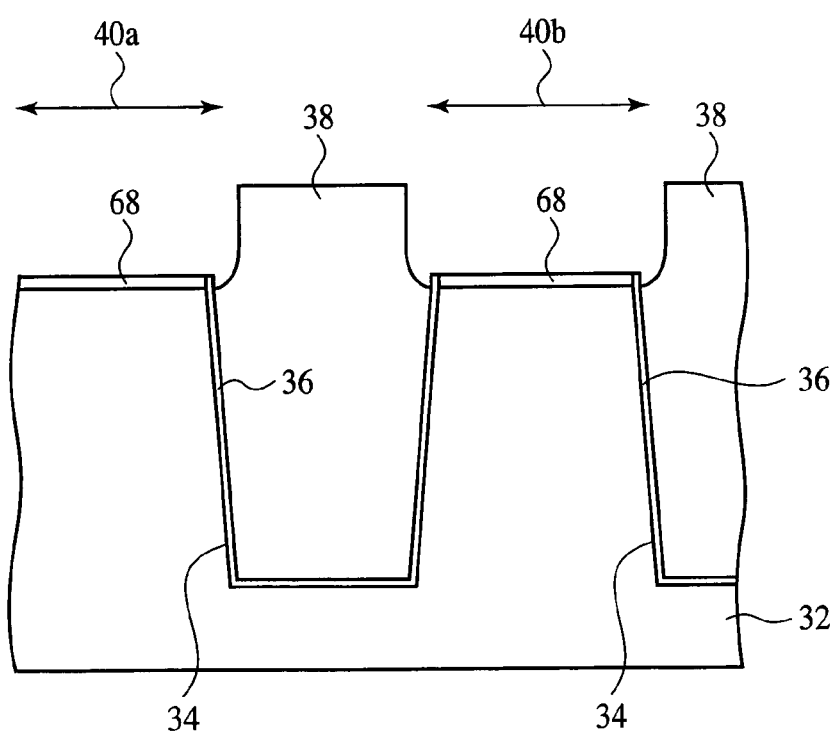

Next, the silicon nitride film 70 is removed by wet etching using, e.g., hot phosphoric acid (see FIG. 10B).

Thus, the device isolation films 38 of the silicon oxide film buried in the trenches 34 is formed by STI (Shallow Trench Isolation), and the device regions 40a, 40b are defined by the device isolation films 38. To define the device regions 40a, 40b, various methods other than STI may be used.

Figure 11A:
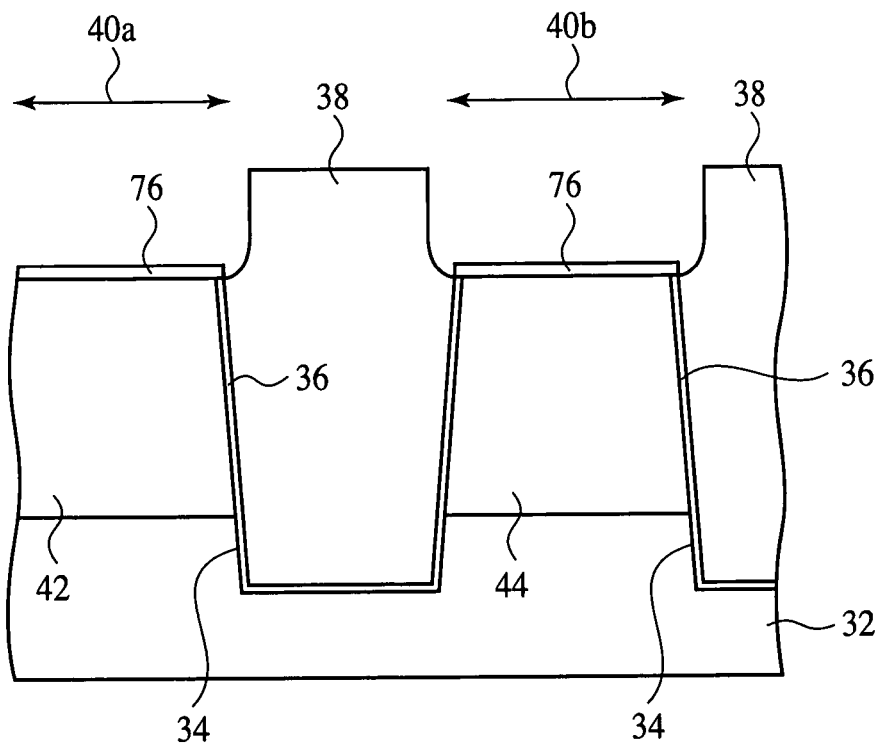
Figure 11B:
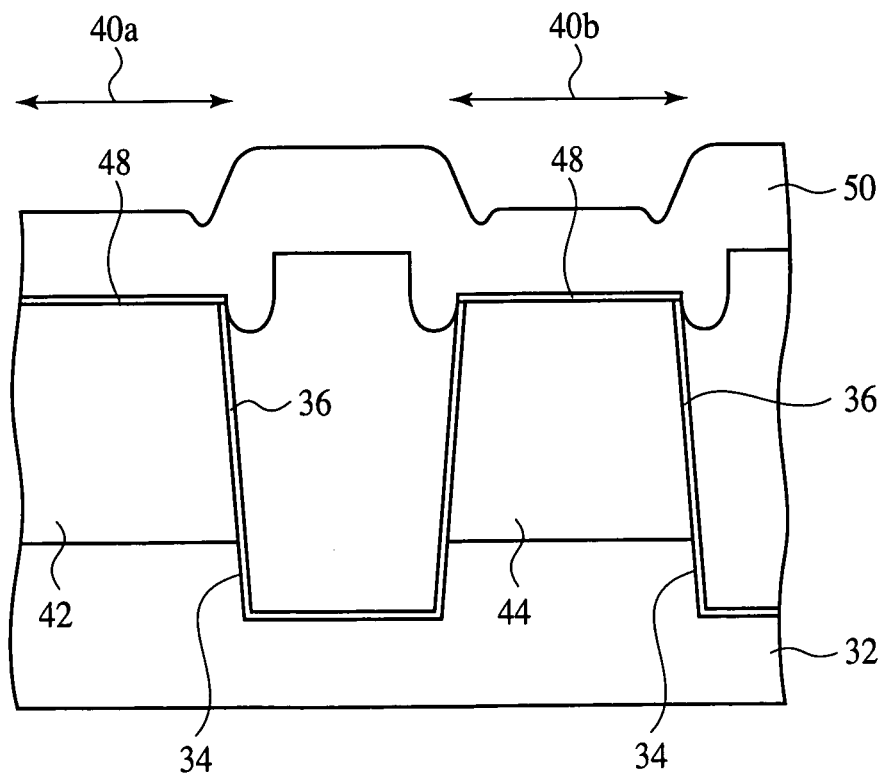

Then, after a sacrifice oxide film 76 of silicon oxide film is formed on the surface of the silicon substrate 32 by, e.g., thermal oxidation, the P well 42 and the N well 44 are formed by, e.g., ion implantation in the silicon substrate 32 respectively in the device region 40a and in the device region 40b (see FIG. 11A).

Then, the sacrifice oxide film 76 is removed by wet etching using, e.g., a hydrofluoric acid-based chemical liquid.

Next, the gate insulation film 48 of a silicon oxide film of, e.g., a 2 nm-thickness is formed on the silicon substrate 32 by, e.g., thermal oxidation.

Next, a polysilicon film 50 of, e.g., a 100 nm-thickness is formed on the entire surface by, e.g., low-pressure CVD. The film deposition temperature is, e.g., about 600° C.

Figure 12A:
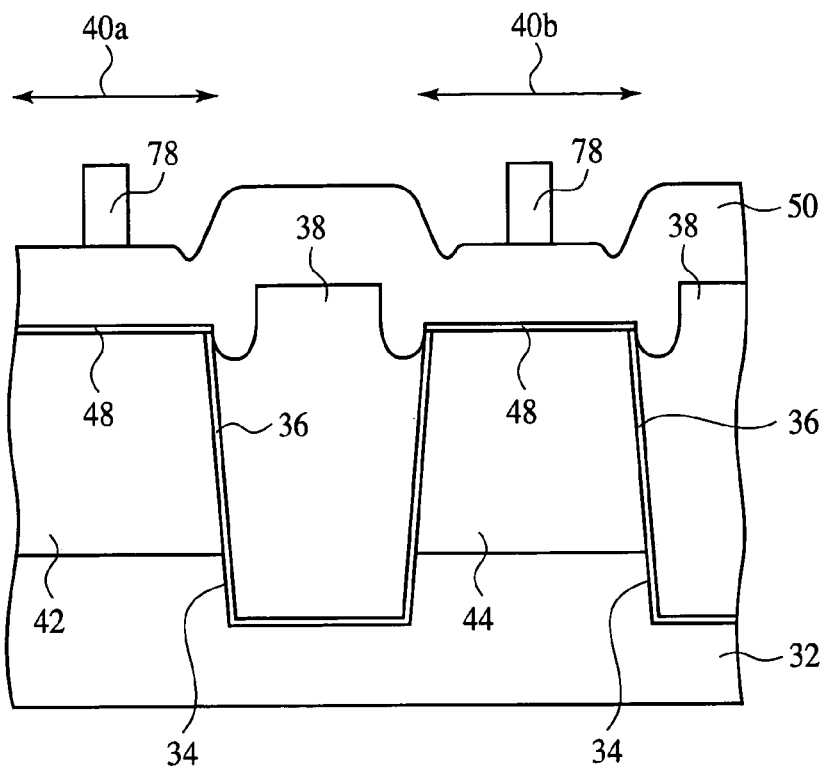
Figure 12B:
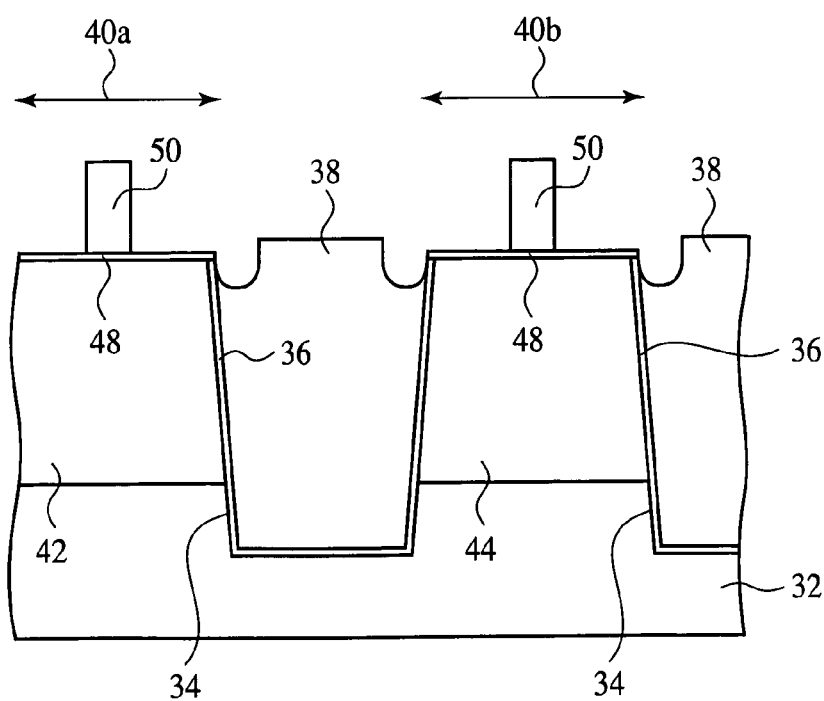

Then, a photoresist film 78 for patterning the polysilicon film 50 is formed on the polysilicon film 50 by photolithography (see FIG. 12A).

Then, with the photoresist film 78 as the mask, the polysilicion film 50 is dry etched to thereby form the gate electrode 50 of the polysilicon film. After the gate electrode 50 has been formed, the photoresist film 78 used as the mask is removed (see FIG. 12B).

Figure 13A:
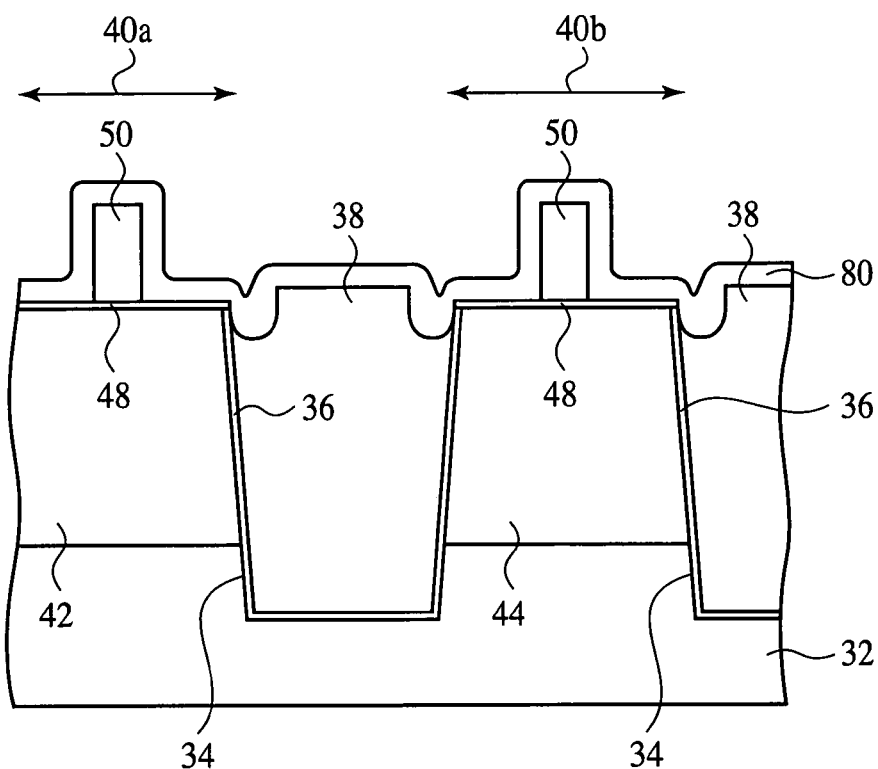
Figure 13B:
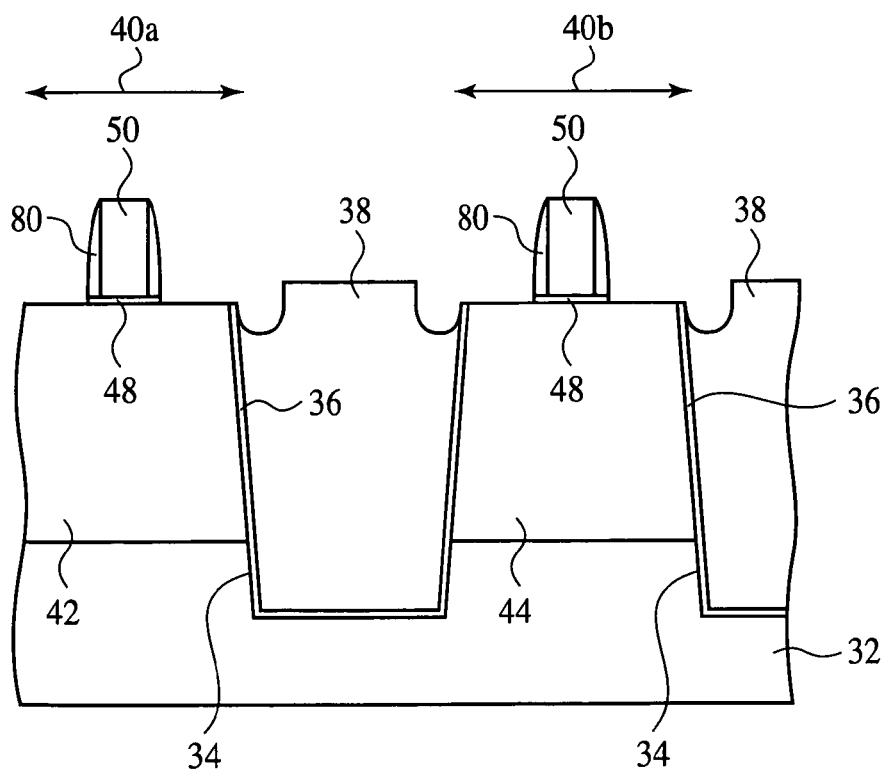
Figure 14A:
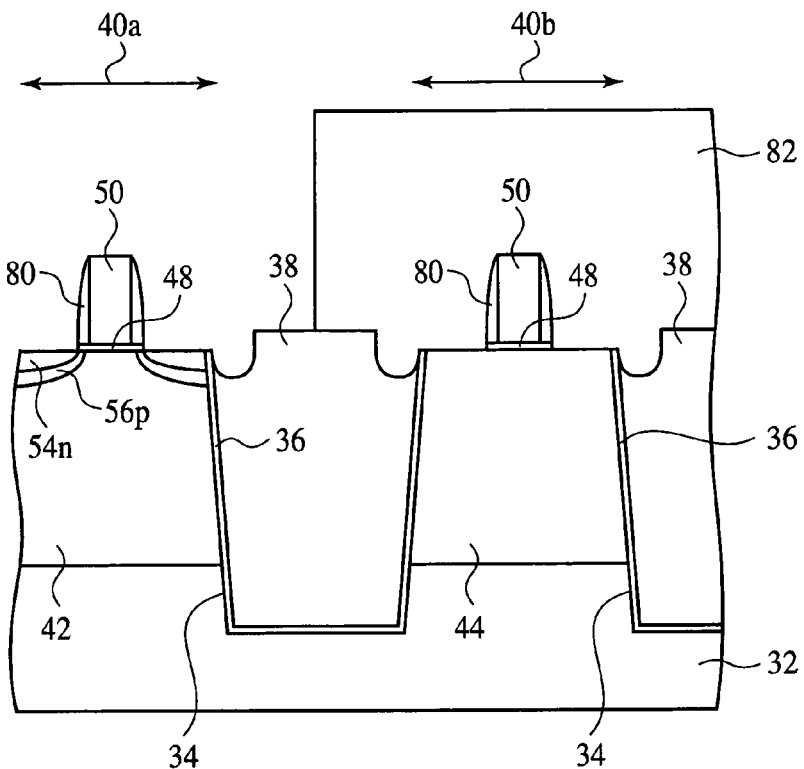
Figure 14B:
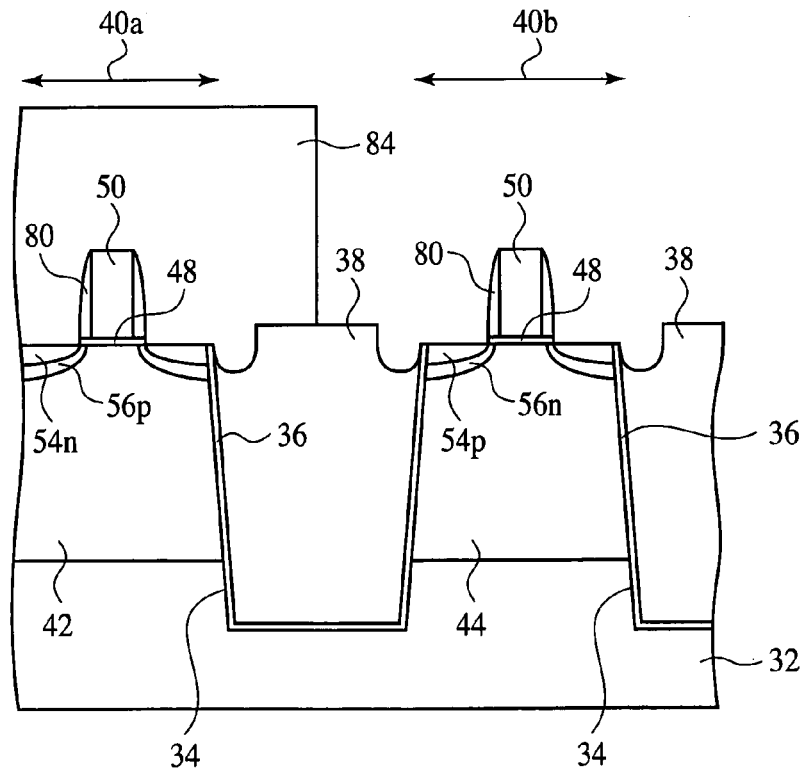

Next, a silicon oxide film 80 of, e.g., a 10 nm-thickness is deposited on the entire surface by, e.g., CVD (see FIG. 13A).

Then, the silicon oxide film 80 is anisotropically etched by, e.g., RIE (Reactive Ion Etching). Thus, the offset sidewall insulation film 80 of the silicon oxide film is formed on the side wall of the gate electrode 50 (see FIG. 13B).

Next, a photoresist film 82 exposing the device region 40a for the NMOS transistor 46n to be formed in and covering the rest region is formed by photolithography.

Next, with the gate electrode 50, the offset sidewall insulation film 80 and the photoresist film 82 as the mask, arsenic ions (As$^+$), for example, are implanted at, e.g., a 3 keV acceleration voltage and a $1.5 \times 10^{15}$ cm$^{-2}$ dose. Thus, n type first impurity diffused regions 54n forming the extension regions of the extension source/drain structure are formed.

Next, with the gate electrode 50, the offset sidewall insulation film 80 and the photoresist film 82 as the mask, boron ions (B$^+$), for example, are implanted at, e.g., a 7 keV acceleration energy and a $4 \times 10^{13}$ cm$^{-2}$ dose. Thus, the p type pocket regions 56p are formed below the bottom surface of the first impurity diffused regions 54n, adjacent to the first impurity diffused regions 54n (see FIG. 14A). In place of boron ions, indium ions (In$^+$) may be implanted.

After the first impurity diffused regions 54n and the pocket regions 56p have been formed, the photoresist film 82 used as the mask is removed.

Then, a photoresist film 84 exposing the device region 40b for the PMOS transistor 46p to be formed in and covering the rest region is formed by photolithography.

Next, with the gate electrode 50, the offset sidewall insulation film 80 and the photoresist film 84 as the mask, boron ions, for example, are implanted at, e.g., a 1 keV acceleration voltage and a $2 \times 10^{15}$ cm$^{-2}$ dose. Thus, the shallow p type first impurity diffused regions 54p forming the extension regions of the extension source/drain structure are formed. In place of boron ions, boron fluoride ions (BF$_2^+$) may be implanted.

Then, with the gate electrode 50, the offset sidewall insulation film 80 and the photoresist film 84 as the mask, arsenic ions, for example, are implanted at, e.g., a 50 keV acceleration voltage and a $2 \times 10^{13}$ cm$^{-2}$ dose. Thus, the n type pocket regions 56n are formed below the bottom surface of the first impurity diffused regions 54p, adjacent to the first impurity diffused regions 54p (see FIG. 14B). In place of arsenic ions, antimony ions (Sb$^+$) may be implanted.

After the first impurity diffused regions 54p and the pocket regions 56n have been formed, the photoresist film 84 used as the mask is removed.

Figure 15A:
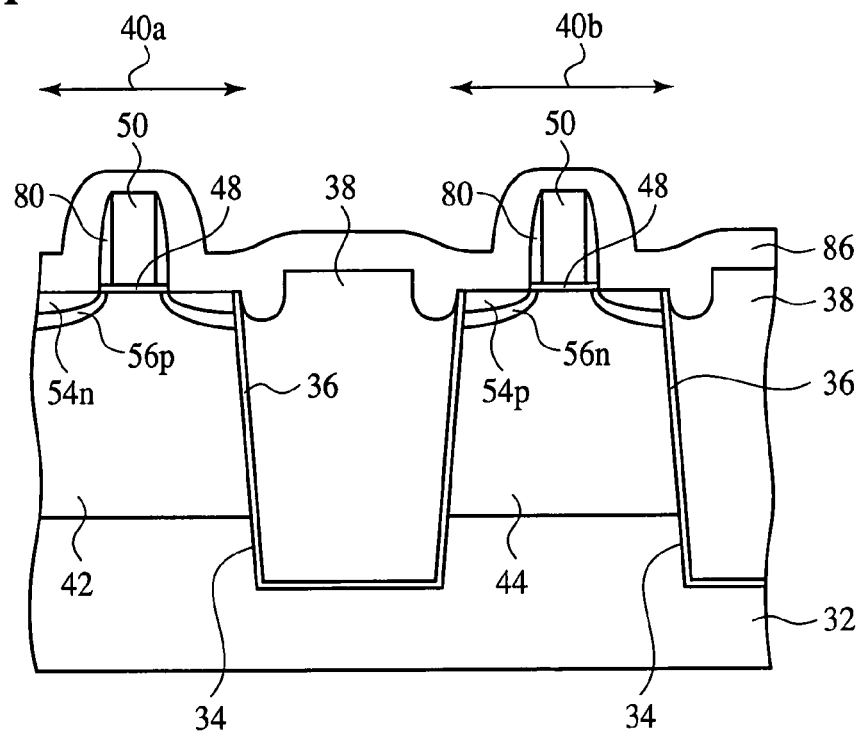
Figure 15B:
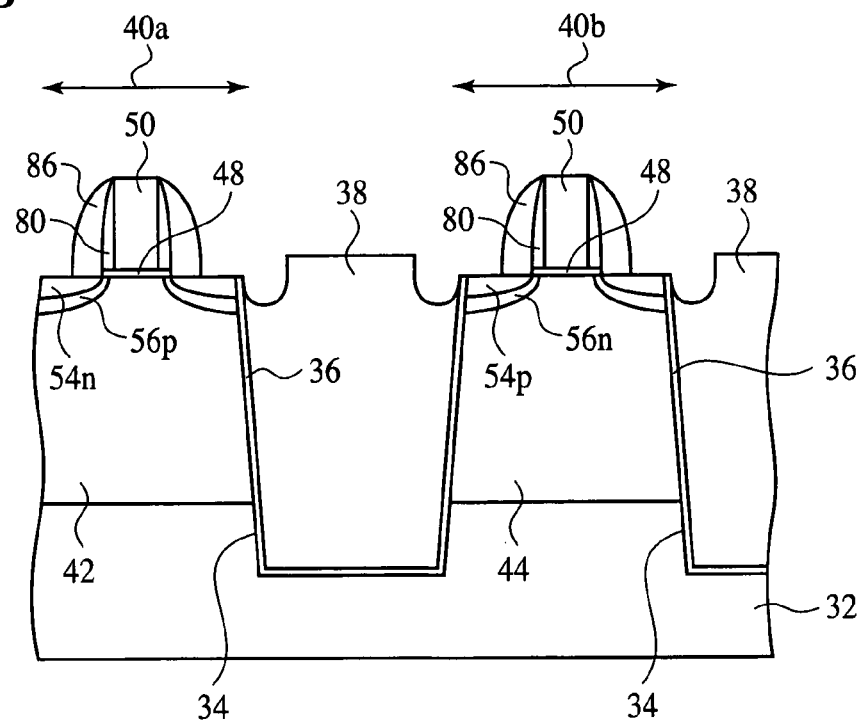
Figure 16A:
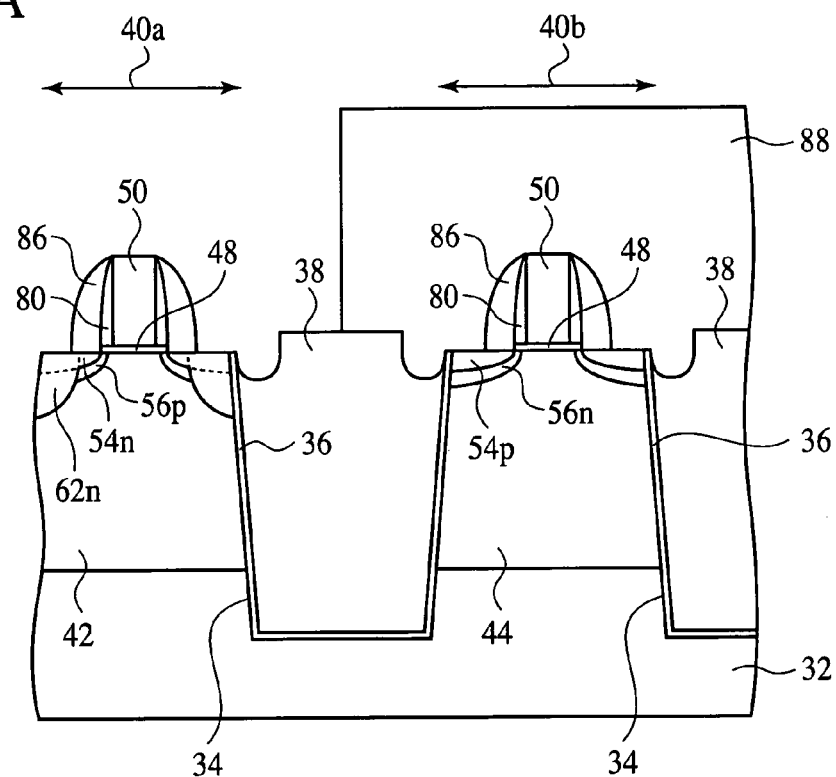
Figure 16B:
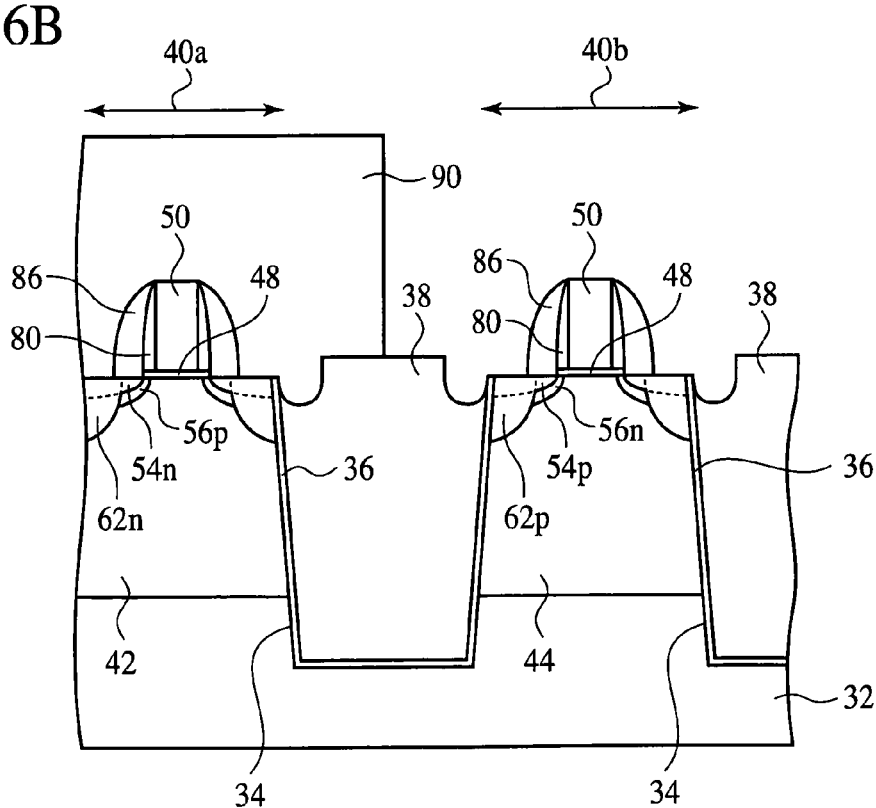

Next, a silicon oxide film 86 of, e.g., a 20–40 nm-thickness is deposited on the entire surface by, e.g., CVD (see FIG. 15A).

Next, the silicon oxide film 86 is anisotropically etched by, e.g., RIE. Thus, the offset sidewall insulation film 86 of the silicon oxide film is further formed on the side wall of the gate electrode 50 with the offset sidewall insulation film 80 formed on (see FIG. 15B).

Next, a photoresist film 88 exposing the device region 40a for the NMOS transistor 46n to be formed in and covering the rest region is formed by photolithography.

Next, with the gate electrode 50, the offset sidewall insulation films 80, 86 and the photoresist film 88 as the mask, arsenic ions, for example, are implanted at, e.g., a 10 keV acceleration voltage and a $2 \times 10^{15}$ cm$^{-2}$ dose. Thus, the n type second impurity diffused regions 62n which are deeper than the first impurity region 54n is formed (see FIG. 16A). In place of arsenic ions, phosphorus ions may be implanted.

After the second impurity diffused regions 62n have been formed, the photoresist film 88 used as the mask is removed.

Next, a photoresist film 90 exposing the device region 40b for the device region 40b to be formed in and covering the rest region is formed by photolithography.

Then, with the gate electrode 50, the offset sidewall insulation film 80, 86 and the photoresist film 90 as the mask, boron ions, for example, are implanted at, e.g., a 1 keV acceleration voltage and a $2 \times 10^{15}$ cm$^{-2}$ dose. Thus, the p type second impurity diffused regions 62p which are deeper than the first impurity diffused regions 54p are formed (see FIG. 16B). In place of boron ions, boron fluoride ions may be implanted.

After the second impurity diffused regions 62p have been formed, the photoresist film 90 used as the mask is removed.

Next, by wet etching using, e.g., a hydrofluoric acid-based chemical liquid, the offset sidewall insulation films 80, 88 are removed, left at a lower part of the side wall of the gate electrode 50 and at the side end of the gate insulation film 48. Thus, the skirt-like insulation film 58 of silicon oxide film covering the ends of the first impurity diffused regions 54n, 54p nearer to the gate electrodes is formed (see FIG. 17A).

After the skirt-like insulation film 58 has been formed, ion implantation for compensating the dopant impurity in the surface of the silicon substrate 32 which has been decreased by the wet etching for forming the skirt-like insulation film 58 may be performed. In this case, a photoresist film (not illustrated) exposing the device region 40a and covering the rest region is formed by photolithography, and then with the photoresist film and the gate electrode 50 as the mask, arsenic ions, for example, are implanted. After the ion implantation, the photoresist film used as the mask is removed. In the same way, a photoresist film (not illustrated) exposing the device region 40b and covering the rest region is formed by photolithography, and then with the photoresist film and the gate electrode 50 as the mask, boron ions, for example, are implanted. After the ion implantation, the photoresist film used as the mask is removed.

Figure 17A:
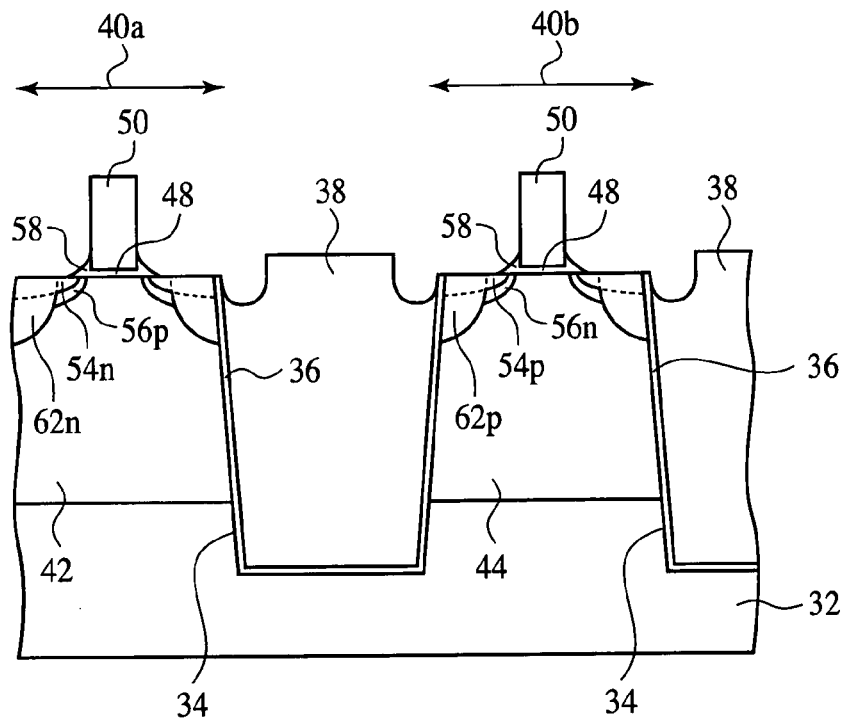
Figure 17B:
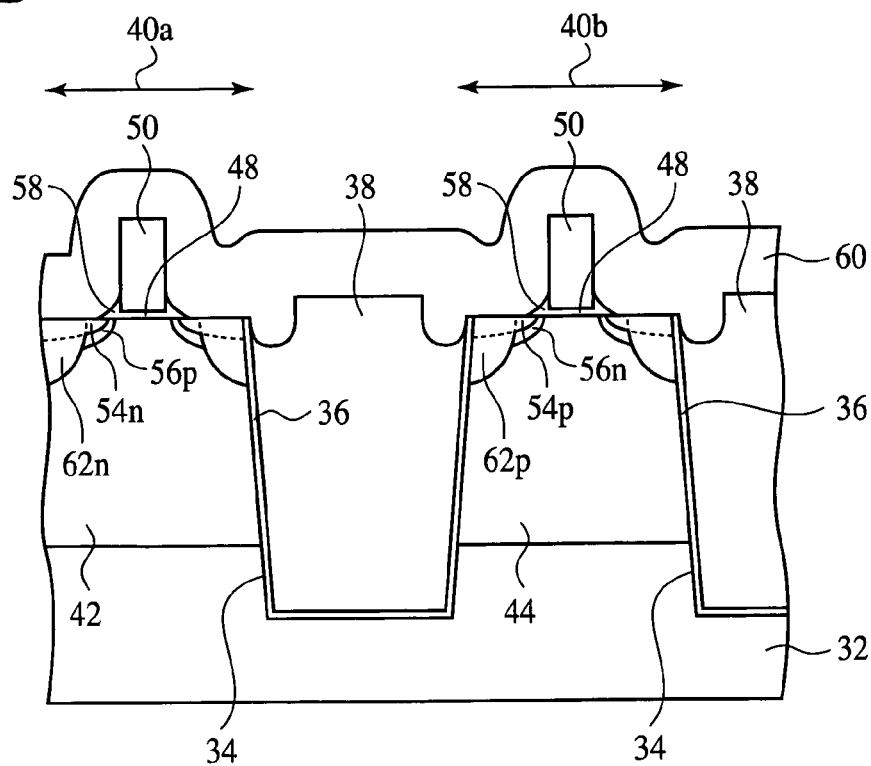
Figure 18A:
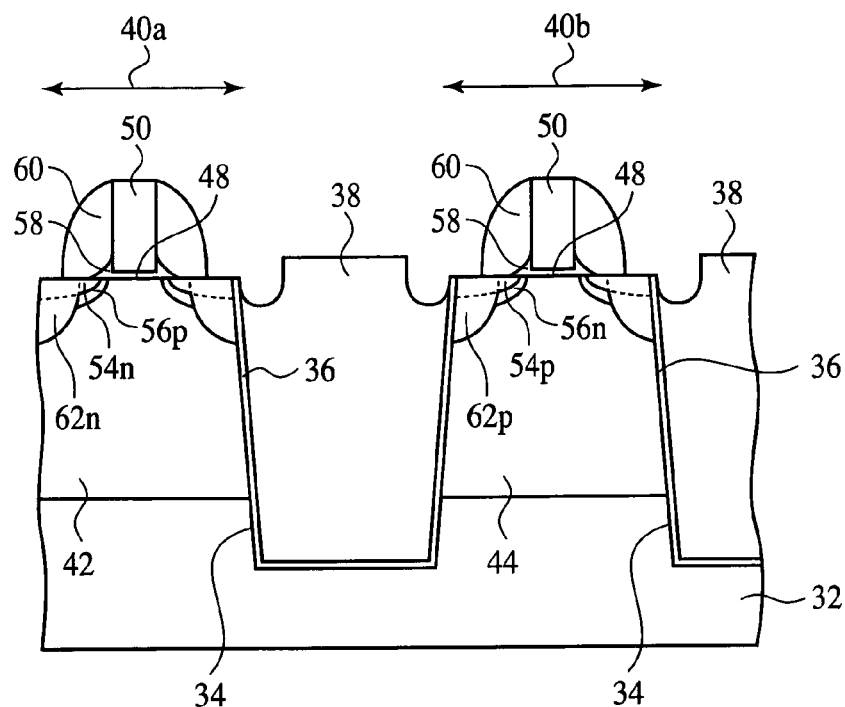
Figure 18B:
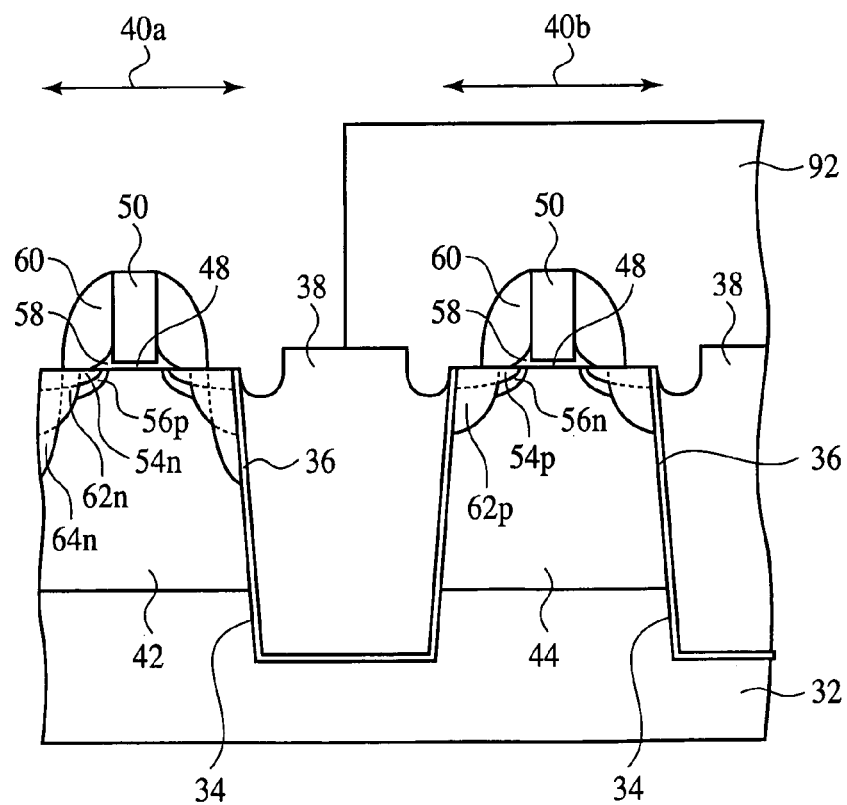

Next, a silicon oxynitride film 60 of, e.g., a 80–100 nm-thickness is deposited on the entire surface by, e.g., CVD (see FIG. 17B).

Then, the silicon oxynitride film 60 is anisotropically etched by, e.g., RIE. Thus, the sidewall insulation film 60 of the silicon oxynitride film is formed on the exposed part of the side wall of the gate electrode, which is not covered by the skirt-like insulation film 58 and on the side surface of the skirt-like insulation film 58 (see FIG. 18A).

Here, the offset sidewall insulation films 80, 86 are partially removed from the upper ends thereof, and only the skirt-like insulation film 58 is formed on a lower part of the side wall of the gate electrode 50. Accordingly, even when the gap between the adjacent gate electrodes 50 is small, the sidewall insulation film 60 can be formed without the gap between the adjacent gate electrodes 50 being filled with the silicon oxynitride film.

Next, a photoresist film 92 exposing the device region 40a for the NMOS transistor 46n to be formed in and covering the rest region is formed by photolithography.

Then, with the gate electrode 50, the sidewall insulation film 60 and the photoresist film 92 as the mask, phosphorus ions, for example, are implanted at an 8 keV acceleration voltage and a $1 \times 10^{16}$ cm$^{-2}$ dose. Thus, the n type third impurity diffused regions 64n which are deeper than the second impurity diffused regions 62n are formed (see FIG. 18B). In place of phosphorus ions, arsenic ions may be implanted.

After the third impurity diffused regions 64n have been formed, the photoresist film 92 used as the mask is removed.

Next, a photoresist film 94 exposing the device region 40b for the PMOS transistor 46p to be formed in and covering the rest region is formed by, e.g., photolithography.

Next, with the gate electrode 50, the sidewall insulation film 60 and the photoresist film 94 as the mask, boron ions, for example, are implanted at, e.g., a 4 keV acceleration voltage and a $5 \times 10^{15}$ cm$^{-2}$ dose. Thus, the p type third impurity diffused regions 64p which are deeper than the second impurity diffused regions 62p is formed (see FIG. 19A). In place of boron ions, boron fluoride ions may be implanted.

After the third impurity diffused regions 64p have been formed, the photoresist film 94 used as the mask is removed.

Next, the implant dopant impurity is activated by thermal processing of, e.g., 1000° C. and 10 seconds. Thus, in the device region 40a, the source/drain diffused layers 66n of the extension source/drain structure formed of the first impurity diffused region 54n, the second impurity diffused region 62n and the third impurity diffused region 64n are formed, and in the device region 40b, the source/drain diffused layers 66p of the extension source/drain structure formed of first impurity diffused region 54p, the second impurity diffused region 62p and the third impurity diffused region 66p are formed.

Figure 19A:
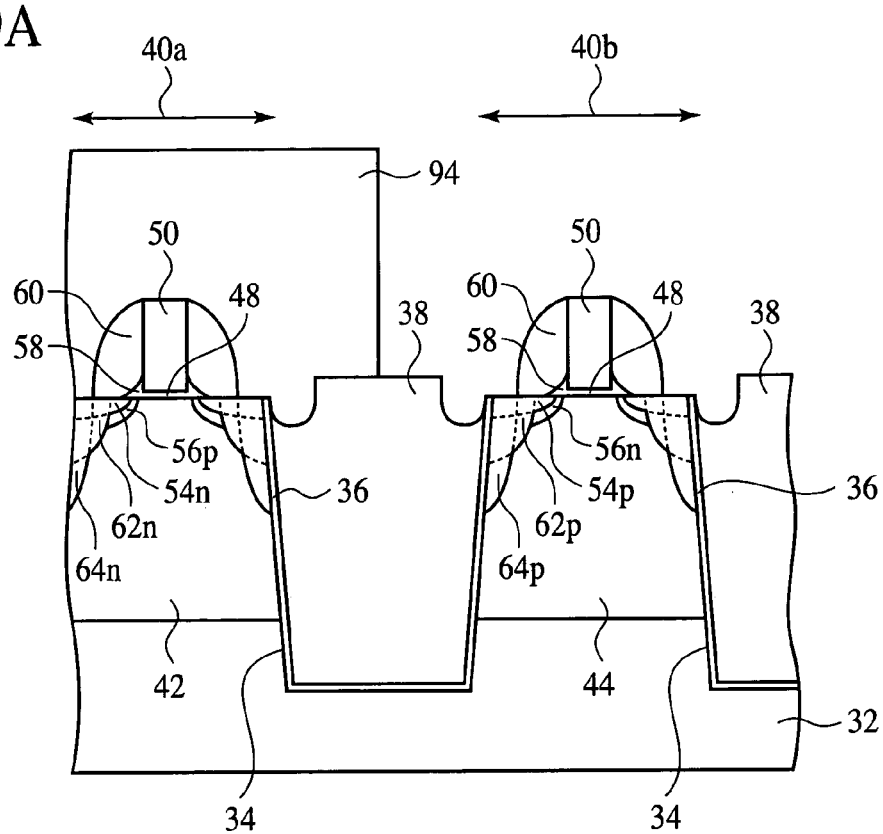
Figure 19B:
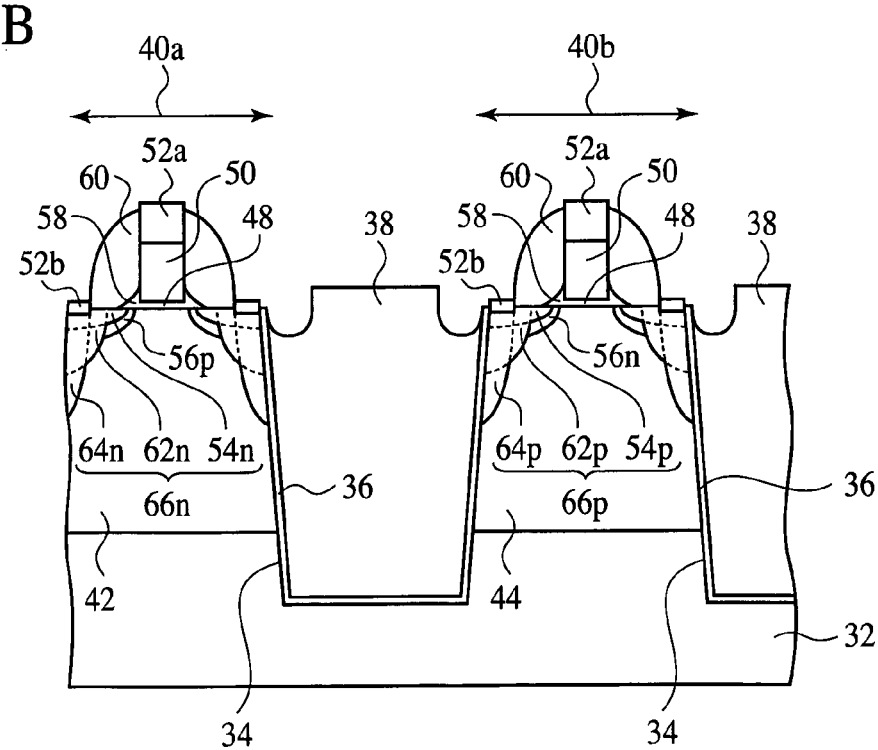

Next, on the gate electrodes 50 and the source/drain diffused layers 66n, 66p, a metal silicide films 52a, 52b a cobalt silicide film of, e.g., a 15 nm-thickness by salicide process (see FIG. 19B). The cobalt silicide film is selectively formed, e.g., by forming a cobalt silicide film by depositing a 5 nm-thickness cobalt film on the entire surface by sputtering, selectively reacting the cobalt film and the exposed parts of the silicon with each other and then removing the cobalt film which has not reacted. In place of cobalt silicide film, a nickel silicide film may be formed as the metal silicide films 52a, 52b.

Thus, the semiconductor device according to the present embodiment is fabricated.

As described above, according to the present embodiment, the offset sidewall insulation films 80, 86 are removed, left at a lower part of the side wall of the gate electrodes 50 and the side end of the gate insulation film 48 to thereby form the skirt-like insulation film 58 covering the ends of the first impurity diffused regions 54n, 54p nearer to the gate electrodes 50, and the sidewall insulation film 60 is formed on the exposed parts of the side walls of the gate electrodes 50 and the side surfaces of the skirt-like insulation film 58, whereby when the gap between the adjacent gate electrodes 50 is small, the sidewall insulation film 60 can be formed in a required film thickness without failure while the deterioration of the characteristics is suppressed.

(Modifications)

Figure 20A:
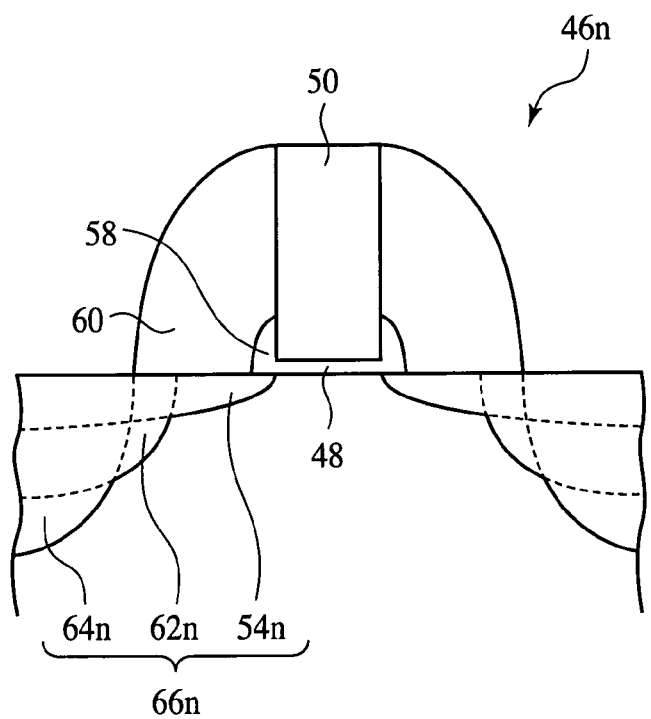
FIGS. 20A–20B are enlarged sectional views of the semiconductor device according to modifications of the first embodiment of the present invention, which illustrate structures thereof.
Figure 20B:
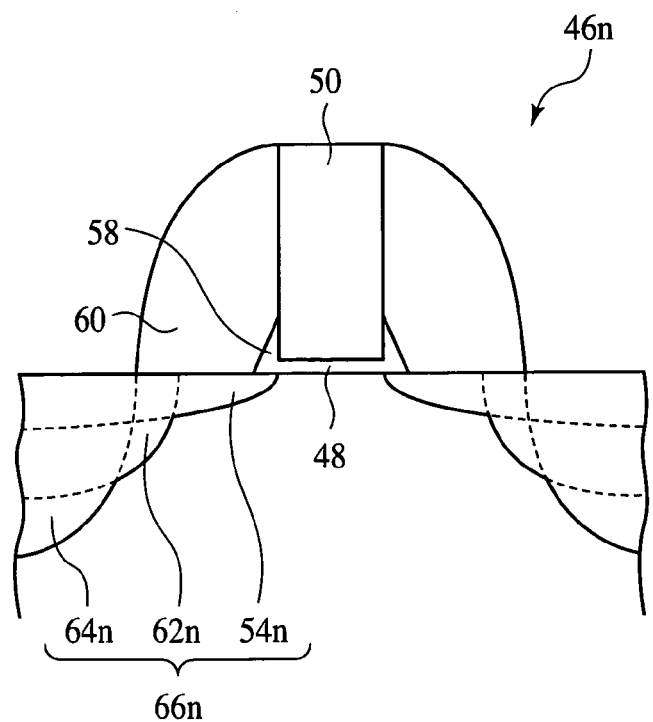

In the present embodiment, as illustrated in FIG. 7, the side surface of the skirt-like insulation film 58 is inwardly convex. However, the side surface of the skirt-like insulation film 58 is not limited to the configuration illustrated in FIG. 7. FIGS. 20A and 20B are enlarged sectional views of the semiconductor device according to modifications of the present embodiment, which illustrate structures thereof.

For example, as illustrated in FIG. 20A, the side surface of the skirt-like insulation film 58 may be outwardly convex.

As illustrated in FIG. 20B, the side surface of the skirt-like insulation film 58 may be substantially plane.

In FIGS. 20A and 20B, structures of the NMOS transistors 46n are illustrated, but configurations of the side surface of the skirt-like insulation film 58 of the PMOS transistor 46p can be the same as illustrated in FIGS. 20A and 20B.

[A Second Embodiment]

Figure 21:
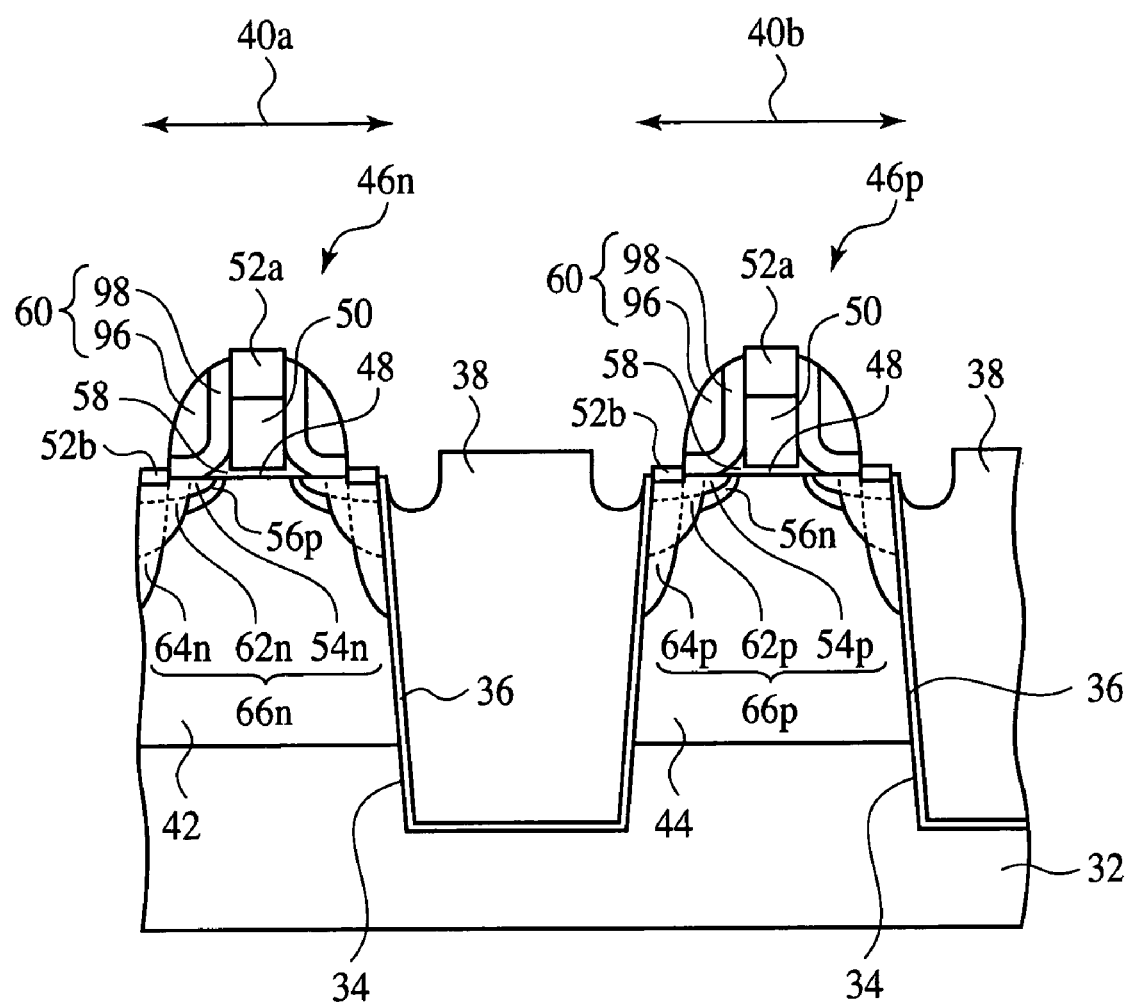
FIG. 21 is a sectional view of the semiconductor device according to a second embodiment of the present invention, which illustrates a structure thereof.
Figure 22:
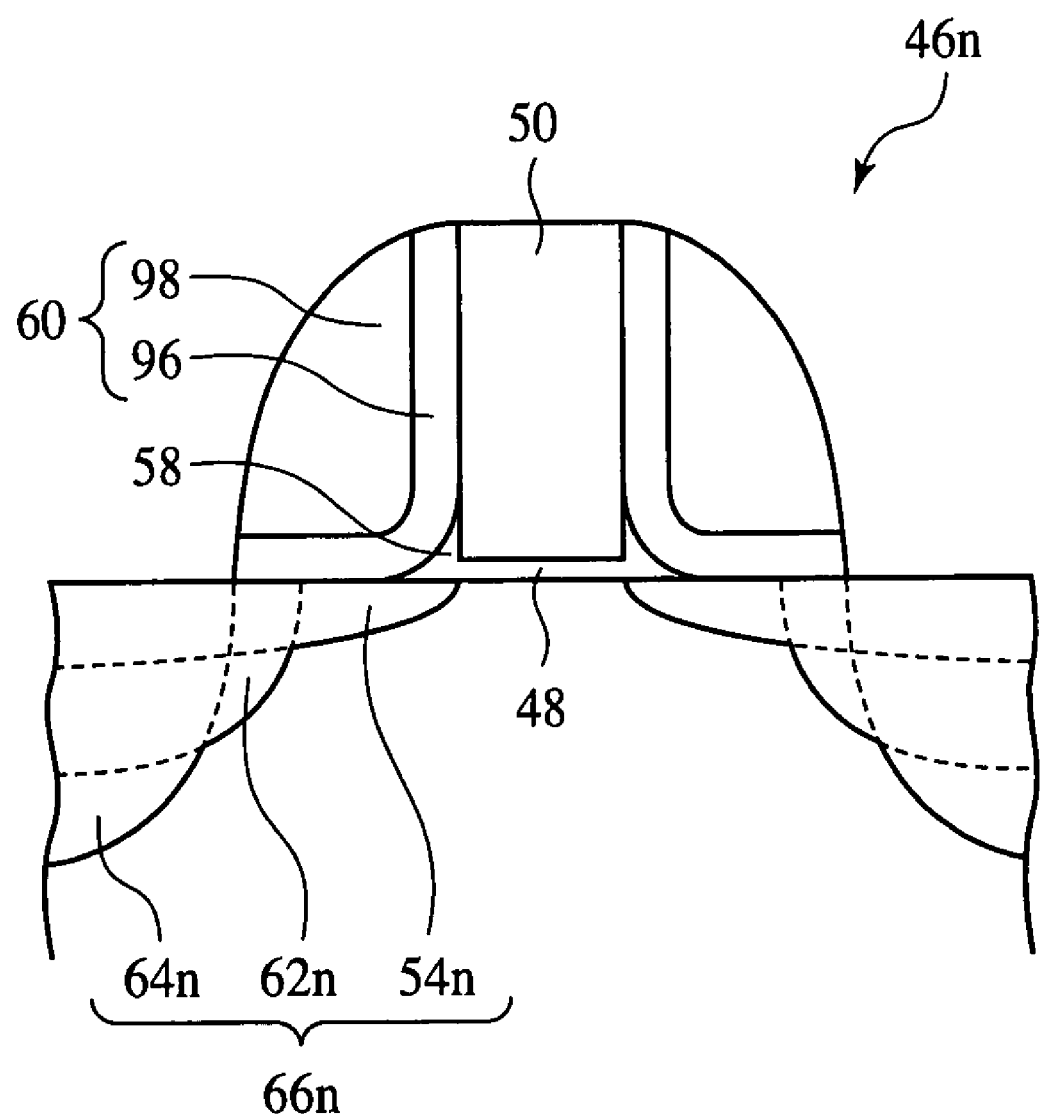
FIG. 22 is an enlarged sectional view of the semiconductor device according to the second embodiment of the present invention, which illustrates the structure thereof.
Figure 23A:
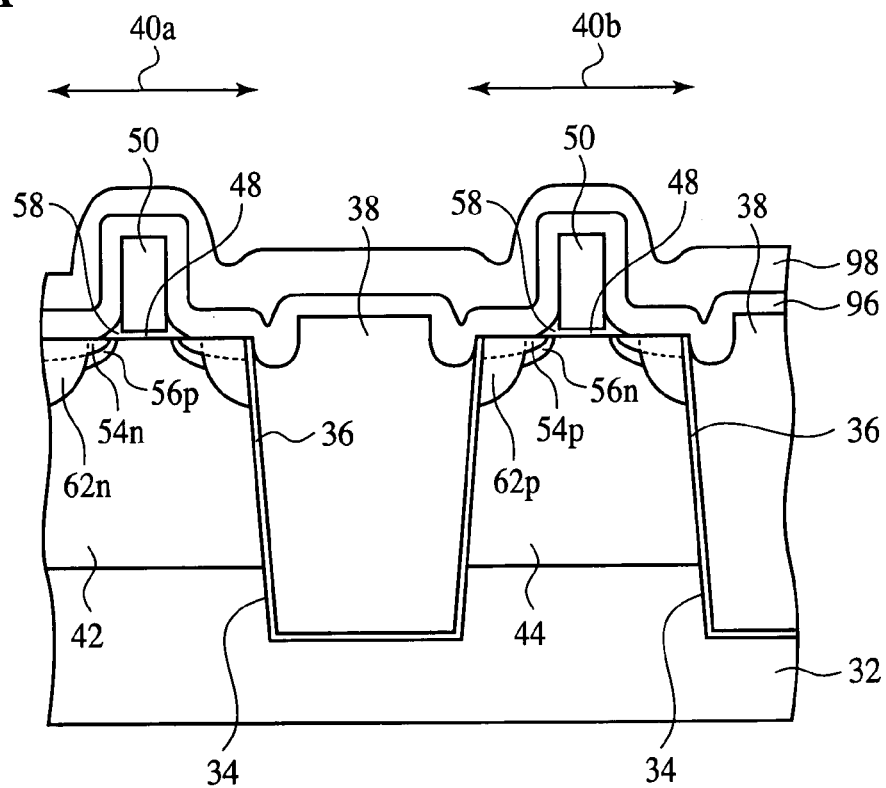
FIGS. 23A–23B are sectional views of the semiconductor device according to the second embodiment of the present invention in the steps of the method for fabricating the same, which illustrate the method.
Figure 23B:
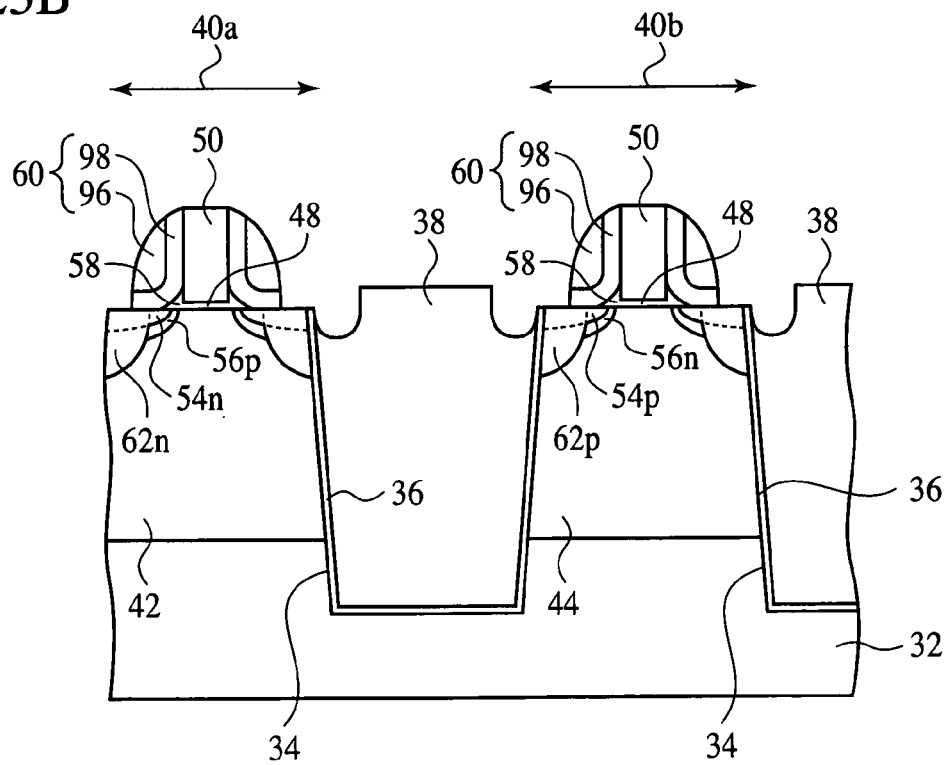

The semiconductor device and the method for fabricating the same according to a second embodiment of the present invention will be explained with reference to FIGS. 21, 22 and 23A–23B. FIG. 21 is a sectional view of the semiconductor device according to the present embodiment, which illustrates a structure thereof. FIG. 22 is an enlarged sectional view of the semiconductor device according to the present embodiment, which illustrates the structure thereof. FIGS. 23A–23B are sectional views of the semiconductor device according to the present embodiment in the steps of the method for fabricating the same, which illustrate the method. The same members of the present embodiment as those of the semiconductor device and the method for fabricating the same according to the first embodiment are represented by the same reference numbers not to repeat or to simplify their explanation.

The structure of the semiconductor device according to the present embodiment is substantially the same as that of the semiconductor device according to the first embodiment. The semiconductor device according to the present embodiment is different from the semiconductor device according to the first embodiment in that in the former, the sidewall insulation film 60 formed on the exposed parts of the side walls of the gate electrodes 50 and the side surface of the skirt-like insulation film 58 is formed of the layer film of a silicon oxide film 96 and a silicon nitride film 98 sequentially laid the latter on the former.

As illustrated in FIG. 21, as in the semiconductor device according to the first embodiment, a skirt-like insulation film 58 of silicon oxide film is formed on lower end parts of the side walls of the gate electrodes 50 and the side end of a gate insulation film 48. The skirt-like insulation film 96 covers the ends of the first impurity diffused regions 54n, 54p nearer to the gate electrodes 50.

A silicon oxide film 96 is formed on the exposed parts of the side walls of the gate electrodes 50, which are not covered by the skirt-like insulation film 58 and the side surfaces of the skirt-like insulation film 58.

A silicon nitride film 98 is formed on the silicon oxide film 96.

Thus, the sidewall insulation film 60 is formed of the layer film of the silicon oxide film 96 and the silicon nitride film 98 thus sequentially laid the latter on the former.

FIG. 22 is an enlarged sectional view of the gate electrode 50 and its periphery of the semiconductor device according to the present embodiment. In FIG. 22, an NMOS transistor 46n is illustrated, and metal silicide films 52a, 52b are omitted.

As illustrated, as in the semiconductor device according to the first embodiment, the skirt-like insulation film 58 is formed on a lower part of the side wall of the gate electrode 50 and on the side end of the gate insulation film 48. The skirt-like insulation film 58 covers the ends of the first impurity diffused regions 54n forming the source/drain diffused layer 66n, which are nearer to the gate electrode 50. The side surface of the skirt-like insulation film 58 is, e.g., inwardly convex.

The interface between the silicon oxide film 96 and the silicon nitride film 98 formed on the skirt-like insulation film 58 is inwardly convex, reflecting the configuration of the side surface of the skirt-like insulation film 58.

The skirt-like insulation film 58 formed on the gate electrode 50 of a PMOS transistor 46p is the same as that formed on the gate electrode 50 of the NMOS transistor 46n.

As described above, the sidewall insulation film 60 formed on the exposed parts of the side walls of the gate electrodes 50, which are not covered by the skirt-like insulation film 58 and the side surfaces of the skirt-like insulation film 58 may be formed of the layer of a plurality of insulation films.

Next, the method for fabricating the semiconductor device according to the present embodiment will be explained with reference to FIGS. 23A–23B.

First, the steps up to the step of forming the skirt-like insulation film 58 including the skirt-like insulation film 58 forming step are the same as the steps of the method for fabricating the semiconductor device according to the first embodiment illustrated in FIGS. 8A to 17A, and their explanation will be omitted.

Next, a silicon oxide film 96 of, e.g., a 10 nm-thickness is deposited on the entire surface by, e.g., CVD.

Next, a silicon nitride film 98 of, e.g., a 70 nm-thickness is deposited on the entire surface by, e.g., CVD (see FIG. 23A).

Next, the silicon nitride film 98 and the silicon oxide film 96 are anisotropically etched respectively by, e.g., RIE. Thus, the sidewall insulation film 60 of the layer of the silicon oxide film 96 and the silicon nitride film 98 sequentially laid the latter on the former is formed on the exposed parts of the side walls of the gate electrodes 50, which are not covered by the skirt-like insulation film 58 and on the side surfaces of the skirt-like insulation film 58 (see FIG. 23B).

The steps following the step of forming the third impurity diffused regions 62n, 62p are the same as those of the method for fabricating the semiconductor device according to the first embodiment illustrated in FIGS. 18B to 19B, and their explanation will be omitted.

As described above, according to the present embodiment, the offset sidewall insulation films 80, 86 are removed, left at lower parts of the side walls of the gate electrodes 50 and the side end of the gate insulation film 48 to thereby form the skirt-like insulation film 58 covering the ends of the first impurity diffused regions 54n, 54p, which are nearer to the gate electrodes 50, and the sidewall insulation film 60 is formed on the exposed parts of the side walls of the gate electrodes 50 and the side surfaces of the skirt-like insulation film 58, whereby when the gap between the adjacent gate electrodes 50 is small, the sidewall insulation film 60 can be formed in a required film thickness without failure while the deterioration of the characteristics is suppressed.

(Modifications)

Figure 24A:
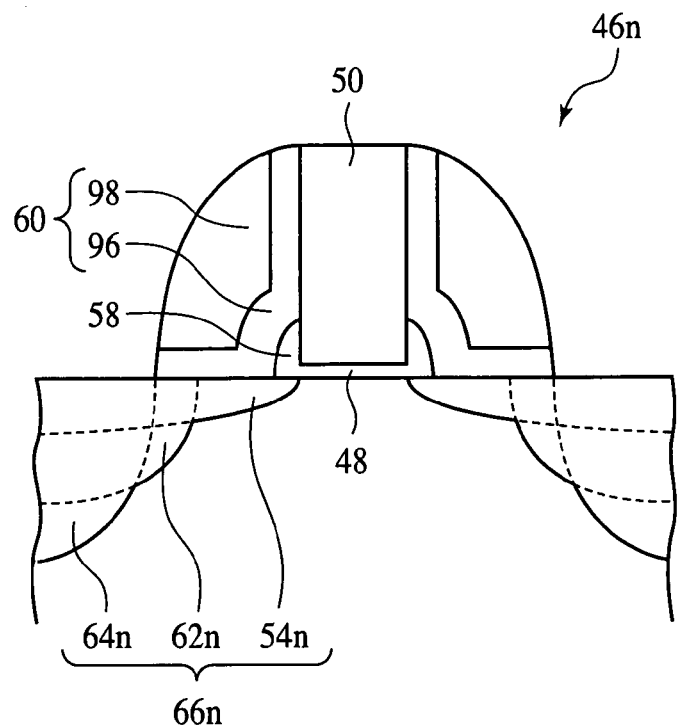
FIGS. 24A–24B are enlarged sectional views of the semiconductor device according to modifications of the second embodiment of the present invention, which illustrate structures thereof.
Figure 24B:
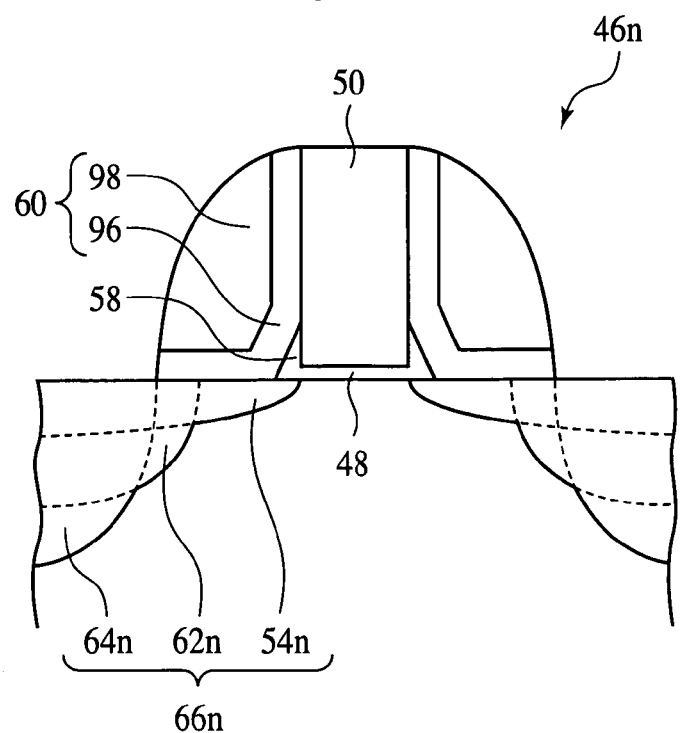

In the present embodiment, as illustrated in FIG. 22, the side surface of the skirt-like insulation film 58 is inwardly convex. However, the side surface of the skirt-like insulation film 58 is not limited to the configuration illustrated in FIG. 22. FIGS. 24A and 24B are enlarged sectional views of the semiconductor device according to modifications of the present embodiment, which illustrate structures thereof.

For example, as illustrated in FIG. 24A, the side surface of the skirt-like insulation film 58 may be outwardly convex. In this case, the interface between the silicon oxide film 96 and the silicon nitride film 98 has a substantially outwardly convex part reflecting the configuration of the side surface of the skirt-like insulation film 58.

As illustrated in FIG. 24B, the side surface of the skirt-like insulation film 58 may be substantially plane. In this case, the interface between the silicon oxide film 96 and the silicon nitride film 98 has a substantially plane part reflecting the configuration of the side surface of the skirt-like insulation film 58.

In FIGS. 24A and 24B, the structures of the NMOS transistors 46n are illustrated, but the PMOS transistor 46p can have the same configuration of the side surface of the skirt-like insulation film 58 as illustrated in FIGS. 24A and 24B.

[Modified Embodiments]

The present invention is not limited to the above-described embodiments and can cover other various modifications.

For example, in the above-described embodiments, the CMOS transistor including the NMOS transistor 46n and the PMOS transistor 46p is explained. However, the present invention is applicable to the fabrication of an NMOS transistor alone or a PMOS transistor alone.

In the above-described embodiments, the gate electrodes 50 are formed of polysilicon film, but the material and the structure of the gate electrodes 50 are not limited to the above. For example, the gate electrodes 50 may have the polymetal structure of a layer of a metal film formed on a polysilicon film.

In the above-described embodiments, the skirt-like insulation film 58 is formed of silicon oxide film, but the material of the skirt-like insulation film 58 is not limited to silicon oxide film. For example, silicon oxide film forming the skirt-like insulation film 58 may contain carbon.

In the above-described embodiments, the sidewall insulation film 60 is formed of silicon oxynitride film and the layer film of the silicon oxide film 96 and the silicon nitride film 98. The material and the structure of the sidewall insulation film 60 are not limited to the above. For example, the silicon oxynitride film, silicon oxide film and silicon nitride film forming the sidewall insulation film 60 may contain carbon. The sidewall insulation film 60 can be a layer of 2 or more insulation films. For example, the sidewall insulation film 60 may be formed of the layer film of a silicon oxide film, a silicon nitride film and a silicon oxide film sequentially laid one or another.

What is claimed is:

1. A method for fabricating a semiconductor device comprising the steps of:

forming a gate electrode over a semiconductor substrate with a gate insulation film formed therebetween;

implanting a dopant impurity into the semiconductor substrate with the gate electrode as a mask to form a first impurity diffused region in the semiconductor substrate on both sides of the gate electrode;

depositing a first insulation film over the semiconductor substrate and anisotropically etching the first insulation film to form the first insulation film on a side wall of the gate electrode;

implanting a dopant impurity into the semiconductor substrate with the gate electrode and the first insulation film as a mask to form a second impurity diffused region in the semiconductor substrate on both sides of the gate electrode;

partially removing the first insulation film, leaving the first insulation film in a skirt-like form at a lower part of the side wall of the gate electrode, the first insulation film covering an end of the first impurity diffused region nearer to the gate electrode; and depositing a second insulation film over the semiconductor substrate and anisotropically etching the second insulation film to form the second insulation film on an exposed part of the side wall of the gate electrode, which is not covered by the first insulation film and on a side surface of the first insulation film.

2. A method for fabricating a semiconductor device according to claim 1, which further comprises after the step of forming the gate electrode and before the step of forming the first impurity diffused region, the step of depositing a third insulation film over the semiconductor substrate and anisotropically etching the third insulation film to form the third insulation film on the side wall of the gate electrode, and in which in the step of forming the first insulation film, the first insulation film is further formed on the side wall of the gate electrode with the third insulation film formed on, and in the step of partially removing the first insulation film, the third insulation film is partially removed together with the first insulation film, being left partially at a lower part of the side wall of the gate electrode.

3. A method for fabricating a semiconductor device according to claim 1, further comprising after the step of partially removing the first insulation film and before the step of forming the second insulation film, the step of implanting a dopant impurity into the semiconductor substrate on both sides of the gate electrode.

4. A method for fabricating a semiconductor device according to claim 1, further comprising after the step of forming a second insulation film, the step of implanting a dopant impurity into the semiconductor substrate with the gate electrode and the second insulation film as a mask to form a third impurity diffused region in the semiconductor substrate on both sides of the gate electrode.

5. A method for fabricating a semiconductor device according to claim 1, wherein the first insulation film is partially removed by wet etching.

* * * * *